US012688901B2

(12) United States Patent
Yun

(10) Patent No.: US 12,688,901 B2
(45) Date of Patent: Jul. 21, 2026

(54) SEMICONDUCTOR DEVICE THAT DETECTS CONNECTION DEFECTS BETWEEN WORD LINES AND BIT LINES AND TEST METHOD FOR THE SAME

(71) Applicant: SK hynix Inc., Icheon-si Gyeonggi-do (KR)

(72) Inventor: Tae Sik Yun, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 169 days.

(21) Appl. No.: 18/652,457

(22) Filed: May 1, 2024

(65) Prior Publication Data

US 2025/0218522 A1 Jul. 3, 2025

(30) Foreign Application Priority Data

Dec. 28, 2023 (KR) ........................ 10-2023-0194980

(51) Int. Cl.
| | |
|---|---|
| *G11C 29/02* | (2006.01) |
| *G11C 5/14* | (2006.01) |
| *G11C 7/08* | (2006.01) |
| *G11C 7/12* | (2006.01) |
| *G11C 7/18* | (2006.01) |
| *G11C 8/08* | (2006.01) |

(52) U.S. Cl.
CPC ............ *G11C 29/026* (2013.01); *G11C 5/147* (2013.01); *G11C 7/08* (2013.01); *G11C 7/12* (2013.01); *G11C 7/18* (2013.01); *G11C 8/08* (2013.01)

(58) Field of Classification Search
CPC .......... G11C 7/12; G11C 29/026; G11C 29/08
USPC ......................................................... 365/201
See application file for complete search history.

(56) References Cited

U.S. PATENT DOCUMENTS

| | | | |
|---|---|---|---|
| 10,269,410 B2 * | 4/2019 | Won | G11C 11/4094 |
| 2013/0215697 A1 * | 8/2013 | Choi | G11C 29/02 |
| | | | 365/203 |
| 2014/0085992 A1 | 3/2014 | Wayne et al. | |
| 2023/0123830 A1 | 4/2023 | Lin | |

FOREIGN PATENT DOCUMENTS

KR       1020180094383 A       8/2018

* cited by examiner

*Primary Examiner* — Anthan Tran
(74) *Attorney, Agent, or Firm* — WILLIAM PARK AND ASSOCIATES LTD.

(57) ABSTRACT

A semiconductor device includes a control circuit configured to deactivate a word line during an active operation during a test mode, generate a matching control signal and a sense amplifier drive signal, and activate the word line after a settling period during the test mode, and a sense amplifier configured to drive a bit line and an inverted bit line to a same voltage level based on the matching control signal during the mismatching cancellation operation, and sense and amplify a voltage difference between the bit line and the inverted bit line based on the sense amplifier drive signal when the word line is activated after the settling period during the test mode.

31 Claims, 16 Drawing Sheets

ACT →

210
DRV
SIG
GEN

SAP1
SAP2
SAN

220
VOLT
GEN

→ RTO
→ SB

SEMICONDUCTOR DEVICE THAT DETECTS CONNECTION DEFECTS BETWEEN WORD LINES AND BIT LINES AND TEST METHOD FOR THE SAME

CROSS-REFERENCE TO RELATED APPLICATIONS

The present application claims priority under 35 U.S.C. § 119(a) to Korean Patent Application No. 10-2023-0194980, filed on Dec. 28, 2023, which application is incorporated herein by reference in its entirety.

BACKGROUND

1. Technical Field

Some embodiments of the present disclosure relate to semiconductor devices that detects connection defects in word lines and bit lines after a mismatching cancellation operation and test methods for the same.

2. Related Art

In general, semiconductor devices receive power supply voltage VDD and ground voltage VSS from outside the semiconductor device to generate internal voltages utilized for internal operations. The voltages utilized for the internal operations of a semiconductor device include a core voltage VCORE supplied to a core region of a memory circuit, a high voltage VPP used to drive the word line or used during overdriving, a back bias voltage VBB supplied as a bulk voltage of an NMOS transistor in the core region, a core voltage VCORE, and a pre-charge voltage VBLP used in the core region.

As technology advances, the spacing between bit line pairs connected to memory cells of a semiconductor device is becoming very narrow, and the voltage levels of the bit line pairs vary according to changes in the voltage levels of adjacent bit line pairs, causing a problem in the reliability of input and output data.

SUMMARY

In accordance with an embodiment of the present disclosure, a semiconductor device may include a control circuit configured to deactivate a word line during an active operation during a test mode, generate a matching control signal and a sense amplifier drive signal, and activate the word line after a settling period during the test mode, and a sense amplifier configured to drive a bit line and an inverted bit line to a same voltage level based on the matching control signal during the mismatching cancellation operation, and sense and amplify a voltage difference between the bit line and the inverted bit line based on the sense amplifier drive signal when the word line is activated after the settling period during the test mode.

In accordance with another embodiment of the present disclosure, a semiconductor device may include a voltage control circuit configured to generate a voltage level of a first supply voltage at a first setting level, generate a voltage level of a second supply voltage at a third setting level, and subsequently generate a voltage at a second setting level for the first supply voltage and the second supply voltage during a mismatching cancellation operation, and a sense amplifier configured to receive the first supply voltage and the second supply voltage, to drive a bit line and an inverted bit line to a same voltage level based on a matching control signal and a sense amplifier drive signal during the mismatching cancellation operation, to receive the first supply voltage and the second supply voltage, and to sense and amplify a voltage difference between the bit line and the inverted bit line when a word line is activated after a settling period during a test mode.

In accordance with another embodiment of the present disclosure, a test method may include entering a test mode and deactivating a word line during a first active operation; performing mismatching cancellation including: disabling a sense amplifier drive signal, generating a first supply voltage at a first setting level, generating a second supply voltage at a third setting level, and driving a bit line and an inverted bit line to a same voltage level; and generating the first supply voltage and the second supply voltage at a second setting level, sensing and amplifying a voltage difference between the bit line and the inverted bit line when the word line is activated during a second active operation, and sensing voltage levels of the bit line and the inverted bit line to detect connection defects between the word line and the bit line.

In accordance with another embodiment of the present disclosure, a semiconductor device may include a control circuit configured to deactivate a word line from an input time of an active command to an input time of a burst command during a test mode, to generate a matching control signal and a sense amplifier drive signal, and to activate the word line after a settling period during the test mode, and a sense amplifier configured to drive a bit line and an inverted bit line to a same voltage level based on the matching control signal during a mismatching cancellation operation and to sense and amplify a voltage difference between the bit line and the inverted bit line based on the sense amplifier drive signal when the word line is activated after the settling period during the test mode.

In accordance with another embodiment of the present disclosure, a method may include, during a first operation of a test mode, deactivating a word line and performing mismatching cancellation including generating a first supply voltage at a first setting level, generating a second supply voltage at a third setting level, and driving a bit line and an inverted bit line to a same voltage level; and during a second operation of the test mode, sensing and amplifying a voltage difference between the bit line and the inverted bit line when the word line is activated and sensing voltage levels of the bit line and the inverted bit line to detect connection defects between the word line and the bit line.

BRIEF DESCRIPTION OF THE DRAWINGS

FIG. 3 is a block diagram illustrating an embodiment of a voltage control circuit of a semiconductor device.

FIG. 4 is a circuit diagram illustrating an embodiment of a voltage generation circuit of a voltage control circuit.

FIG. 6 is a circuit diagram illustrating an embodiment of a memory cell of a semiconductor device.

FIG. 11 is a block diagram illustrating an alternative embodiment of a control circuit of a semiconductor device.

FIG. 15 is a circuit diagram illustrating an embodiment of a start signal generation circuit of a voltage control circuit.

FIG. 16 is a diagram illustrating an embodiment of an electronic system including a semiconductor device according to an embodiment.

DETAILED DESCRIPTION

In the following description, when a parameter is referred to as "predetermined," a value of the parameter may be determined in advance or when the parameter is used in a process or an algorithm. The value of the parameter may be set when the process or the algorithm starts or may be set during a period in which the process or the algorithm is executed.

Although the terms "first," "second," "third," and so forth are used herein to describe various elements, these elements should not be limited by such terms. These terms are only used to distinguish one element from another element and are not intended to imply an order or number of elements. Thus, a first element in some embodiments could be identified as a second element in other embodiments without departing from the teachings of the present disclosure.

When an element is referred to as "connected" or "coupled" to another element, the element can be directly connected or coupled to the other element or intervening elements may be present. In contrast, when an element is referred to as being "directly connected" or "directly coupled" to another element, no intervening elements are present.

A logic "high" level and a logic "low" level are used to describe logic levels of electric signals. A signal at a logic "high" level may be distinguished from a signal at a logic "low" level. For example, when a signal at a first voltage corresponds to a signal at a logic "high" level, a signal at a second voltage corresponds to a signal at a logic "low" level. In an embodiment, the logic "high" level is a voltage level that is higher than a voltage level of the logic "low" level. Logic levels of signals may be set to be different or opposite according to the embodiments. For example, a certain signal at a logic "high" level in one embodiment may be at a logic "low" level in another embodiment.

Various embodiments of the present disclosure are described in more detail with reference to the accompanying drawings. The embodiments described herein are intended for illustrative purposes only and are not intended to limit the scope of the present disclosure. To solve this problem, a mismatching cancellation operation is performed in which the voltage levels of the bit line pair are driven to the same voltage level, and data is input and output through a sensing operation during an active operation, thereby achieving data reliability.

Figure 1:
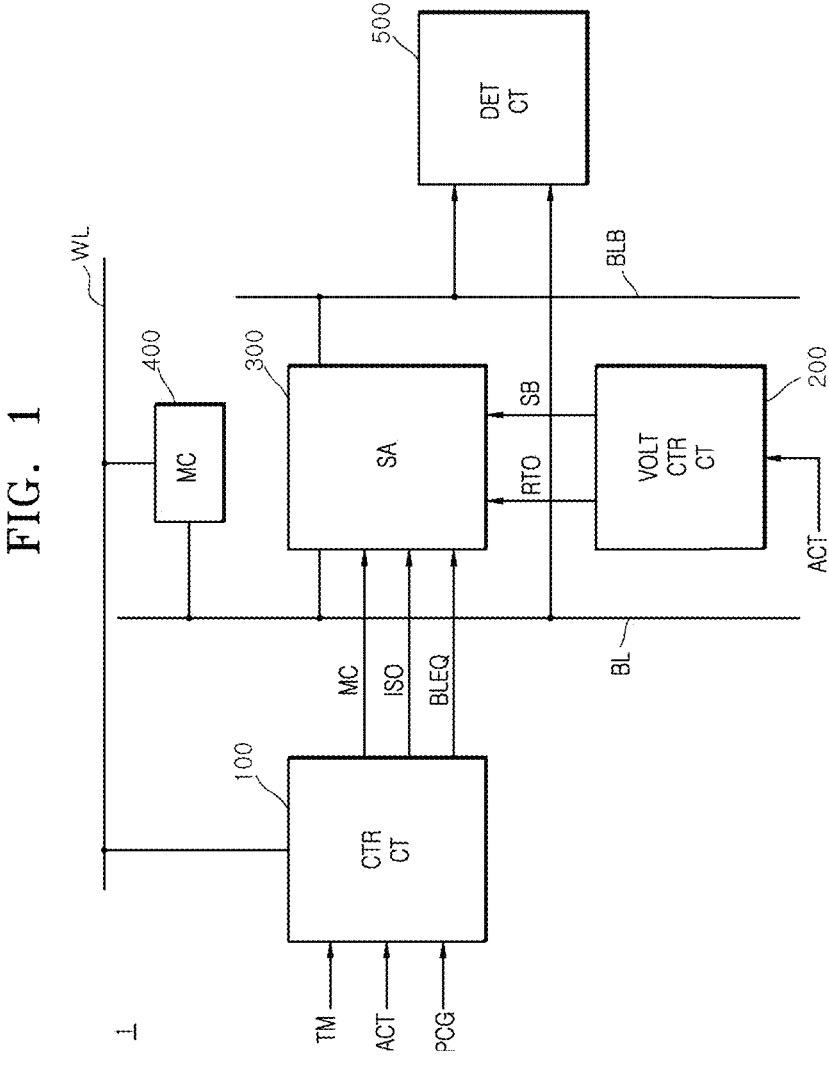
FIG. 1 is a block diagram illustrating a semiconductor device according to an embodiment of the present disclosure.

FIG. 1 is a block diagram illustrating a semiconductor device 1 according to an embodiment of the present disclosure. As shown in FIG. 1, the semiconductor device 1 includes a control circuit 100, a voltage control circuit 200, a sense amplifier 300, a memory cell 400, and a detection circuit 500.

The control circuit 100 generates a matching control signal MC for performing a mismatching cancellation operation, a sense amplifier drive signal ISO for performing a sensing operation, and an equalization signal BLEQ for performing a pre-charge operation based on a test command TM, an active command ACT, and a pre-charge command PCG. The control circuit 100 deactivates a word line WL in response to enabling of a first active command ACT after the test command TM is input or enabled to enter test mode. The control circuit 100 generates the matching control signal MC as enabled in response to enabling of the first active command ACT during the test mode. The control circuit 100 activates the word line WL after a settling period during the test mode in response to enabling of a second active command ACT. The control circuit 100 generates the matching control signal MC as disabled during the test mode when the settling period begins. The control circuit 100 generates the equalization signal BLEQ and the sense amplifier drive signal ISO that are sequentially enabled in response to enabling of the second active command ACT during the test mode. The control circuit 100 generates the equalization signal BLEQ as enabled in response to enabling of the pre-charge command PCG. The test mode is an operation during which detection of connection defects between the word line WL and a bit line BL is performed by blocking the connection between the bit line BL and an inverted bit line BLB during an active operation and detecting when the voltage level of the bit line BL decreases relative to the voltage level of the word line WL. The first active command ACT and the second active command ACT are active commands that are sequentially input. For example, the first active command ACT may refer to a first input or instance of an active command, and the second active command ACT may refer to a second input or instance of an active command following the first active command ACT. When the first active command ACT is enabled, a first action operation is initiated. When the second active command ACT is enabled, a second action operation is initiated.

The settling period is a time period during which the connection between the bit line BL and the inverted bit line BLB is blocked after the mismatching cancellation operation and the voltage level of the bit line BL are sufficiently reduced relative to the voltage level of the word line WL. The settling period may be set to various different time periods depending on the embodiment.

During the mismatching cancellation operation, the voltage control circuit 200 generates a first supply voltage RTO at a voltage level of a core voltage (VCORE in FIG. 4) and a second supply voltage SB at a voltage level of a ground voltage (VSS in FIG. 4), and subsequently generates the first supply voltage RTO and second supply voltage SB at a voltage level of a pre-charge voltage (VBLP in FIG. 5). The voltage control circuit 200 generates the first supply voltage RTO at the voltage level of the core voltage (VCORE in FIG. 4) and the second supply voltage SB at the voltage level of the ground voltage (VSS in FIG. 4) during either a first action operation initiated when the first active command ACT is enabled or a second action operation initiated when the second active command ACT is enabled. During the pre-charge operation, the voltage control circuit 200 generates the first supply voltage RTO and second supply voltage SB at the voltage level of the pre-charge voltage (VBLP in FIG. 5). The voltage control circuit 200 generates the first supply voltage RTO and second supply voltage SB at the voltage level of the pre-charge voltage (VBLP in FIG. 5) when the first active command ACT and the second active command ACT are disabled. The core voltage (VCORE in FIG. 4) and the pre-charge voltage (VBLP in FIG. 5) may be voltages generated by reducing the power supply voltage supplied from outside the semiconductor device 1. The voltage level of the core voltage (VCORE in FIG. 4) may be higher than the voltage level of the pre-charge voltage (VBLP in FIG. 5). The ground voltage VSS may be a general or normal ground voltage. The voltage level of the core voltage (VCORE in FIG. 4) may be a first setting level. The voltage level of the pre-charge voltage (VBLP in FIG. 5) may be a second setting level. The voltage level of the ground voltage VSS may be a third setting level.

The sense amplifier 300 is connected between the bit line BL and the inverted bit line BLB in this embodiment. The sense amplifier 300 drives the bit line BL and the inverted bit line BLB to the same voltage level based on the matching control signal MC during the mismatching cancellation operation. The sense amplifier 300 receives the first supply voltage RTO at the voltage level of the core voltage (VCORE in FIG. 4) and the second supply voltage SB at the voltage level of the ground voltage (VSS in FIG. 4) to drive the bit line BL and inverted bit line BLB to the same voltage level when the matching control signal MC is enabled. The sense amplifier 300 blocks the connection between the bit line BL and the inverted bit line BLB during the settling period. The sense amplifier 300 senses and amplifies the voltage difference between the bit line BL and the inverted bit line BLB in response to the sense amplifier drive signal ISO during a sensing operation after the settling period during the test mode. The sense amplifier 300 receives the first supply voltage RTO at the voltage level of the core voltage (VCORE in FIG. 4) and the second supply voltage SB at the voltage level of the ground voltage (VSS in FIG. 4) to sense and amplify the voltage difference between the bit line BL and the inverted bit line BLB when the word line WL is activated and the sense amplifier drive signal ISO is enabled during the sensing operation after the settling period during the test mode. The sense amplifier 300 drives the bit line BL and inverted bit line BLB to the voltage level of the pre-charge voltage (VBLP in FIG. 5) in response to the equalization signal BLEQ during the pre-charge operation during the test mode. The sense amplifier 300 receives the first supply voltage RTO and second supply voltage SB at the voltage level of the pre-charge voltage (VBLP in FIG. 5) to drive the bit line BL and inverted bit line BLB to the voltage level of the pre-charge voltage (VBLP in FIG. 5) when the equalization signal BLEQ is enabled during the pre-charge operation during the test mode.

The memory cell 400 is connected to both the word line WL and the bit line BL. When the word line WL is activated, the memory cell 400 inputs and output data (not shown) by sharing the charge of the bit line BL and the charge of a storage node (410 in FIG. 6).

Although each of the sense amplifier 300 and the memory cell 400 is shown in FIG. 1 as a single component or structure, a plurality of sense amplifiers and/or a plurality of memory cells may be provided in the core region of a semiconductor device.

The detection circuit 500 senses the voltage levels of the bit line BL and inverted bit line BLB to detect connection defects between the word line WL and bit line BL during the test mode, for example, during the sensing operation. During the test mode, when the voltage level of the bit line BL is generated at the voltage level of the core voltage VCORE and the voltage level of the inverted bit line BLB is generated at the voltage level of the ground voltage VSS, the detection circuit 500 detects that the word line WL is physically and electrically blocked or isolated from the bit line BL, therefore no connection defect is present. During the test mode, when the voltage level of the bit line BL is generated at the voltage level of the ground voltage VSS, and the voltage level of the inverted bit line BLB is generated at the voltage level of the core voltage VCORE, the detecting circuit 500 detects that the word line WL and the bit line BL are physically and electrically connected and when a connection defect occurs. Depending on the embodiment, the detection circuit 500 may be implemented to detect that the word line WL is physically and electrically blocked or isolated from the bit line BL and no connection defect is present when the voltage level of the bit line BL is generated at the voltage level of the ground voltage VSS and the voltage level of the inverted bit line BLB is generated at the voltage level of the core voltage VCORE during the test mode. Depending on the embodiment, the detection circuit 500 may be implemented to detect that the word line WL and the bit line BL are physically and electrically connected, and a connection defect occurs when the voltage level of the bit line BL is generated at the voltage level of the core VCORE and the voltage level of the inverted bit line BLB is generated at the voltage level of the ground voltage VSS during the test mode.

The semiconductor device 1 deactivates the word line WL to perform the mismatching cancellation operation during a first active operation during the test mode. The semiconductor device 1 might not perform the sensing operation after performing the mismatching cancellation operation during the test mode. The semiconductor device 1 blocks the connection between the bit line BL and the inverted bit line BLB during the settling period after performing the mismatching cancellation operation and senses the voltage levels of the bit line BL and the inverted bit line BLB to detect the connection defects between the bit line BL and the word line WL during the second active operation.

Figure 2:
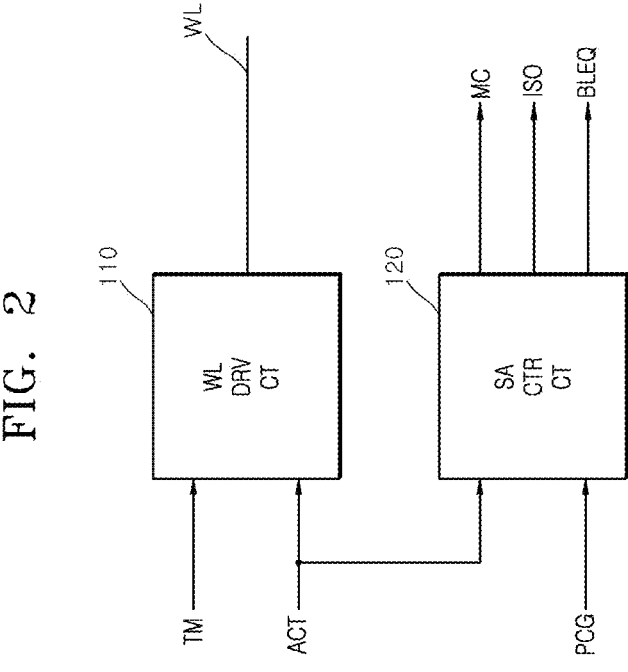
FIG. 2 is a block diagram illustrating an embodiment of a control circuit of a semiconductor device.

FIG. 2 is a block diagram illustrating an embodiment of the control circuit 100, for example, as included in the semiconductor device 1 shown in FIG. 1. The control circuit 100 includes a word line drive circuit 110 and a sense amplifier control circuit 120.

In response to input of the test command TM that initiates the test mode, the word line drive circuit 110 deactivates the word line WL when the first active command ACT is input. After the test command TM is input, the word line drive circuit 110 drives the word line WL to a back bias voltage VBB to deactivate the word line WL in response to input of the first active command ACT. The word line drive circuit 110 activates the word line WL in response to input of the second active command ACT. The word line drive circuit 110 drives the word line WL to a high voltage VPP to activate the word line WL when the second active command ACT is input. The back bias voltage VBB is a voltage at a lower voltage level than the ground voltage VSS. The high voltage VPP is a voltage at a higher voltage level than the power supply voltage supplied from outside the semiconductor device 1. The back bias voltage VBB and high voltage VPP may be voltages generated through a pumping circuit (not shown).

The sense amplifier control circuit 120 generates the matching control signal MC as enabled when the first active command ACT is input. The sense amplifier control circuit 120 generates the matching control signal MC as disabled when the settling period begins. The sense amplifier control circuit 120 generates the equalization signal BLEQ and the sense amplifier drive signal SIO that are sequentially enabled in response to input of the second active command ACT. The sense amplifier control circuit 120 generates the equalization signal BLEQ as enabled in response to input of the pre-charge command PCG.

Figure 3:
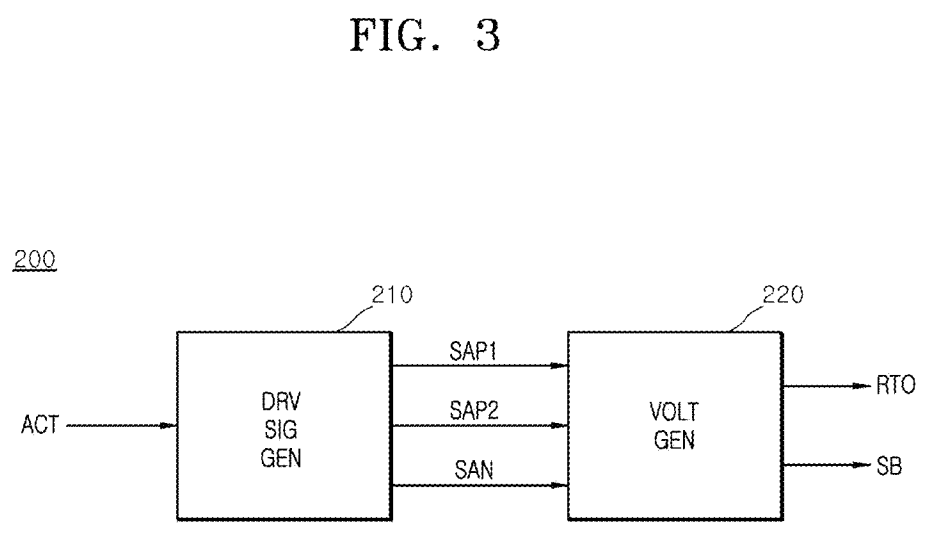

FIG. 3 is a block diagram illustrating an embodiment of the voltage control circuit 200, for example, as included in the semiconductor device 1 shown in FIG. 1. The voltage control circuit 200 includes a drive signal generation circuit 210 and a voltage generation circuit 220.

The drive signal generation circuit 210 generates a first drive signal SAP1, a second drive signal SAP2, and a third drive signal SAN as enabled in response to input or enabling of either the first active command ACT or the second active command ACT. The drive signal generation circuit 210 generates the first drive signal SAP1, the second drive signal SAP2, and the third drive signal SAN that include pulses generated in response to input or enabling of either the first active command ACT or the second active command ACT.

The voltage generation circuit 220 generates the first supply voltage RTO and the second supply voltage SB based on the first drive signal SAP1, the second drive signal SAP2, and the third drive signal SAN. The voltage generation circuit 220 may generate the first supply voltage RTO and second supply voltage SB at the voltage level of the pre-charge voltage (VBLP in FIG. 5) when the first drive signal SAP1, the second drive signal SAP2, and the third drive signal SAN are disabled. The voltage generation circuit 220 may generate the first supply voltage RTO and the second supply voltage SB that are driven at the second setting level when the first drive signal SAP1, the second drive signal SAP2, and the third drive signal SAN are disabled. The voltage generation circuit 220 may generate the first supply voltage RTO at the voltage level of the core voltage (VCORE in FIG. 4) and the second supply voltage SB at the voltage level of the ground voltage (VSS in FIG. 4) when the first drive signal SAP1, the second drive signal SAP2, and the third drive signal SAN are enabled. The voltage generation circuit 220 may generate the first supply voltage RTO that is driven to the first setting level and the second supply voltage SB that is driven to the third setting level when the first drive signal SAP1, the second drive signal SAP2, and the third drive signal SAN are enabled.

Figure 4:
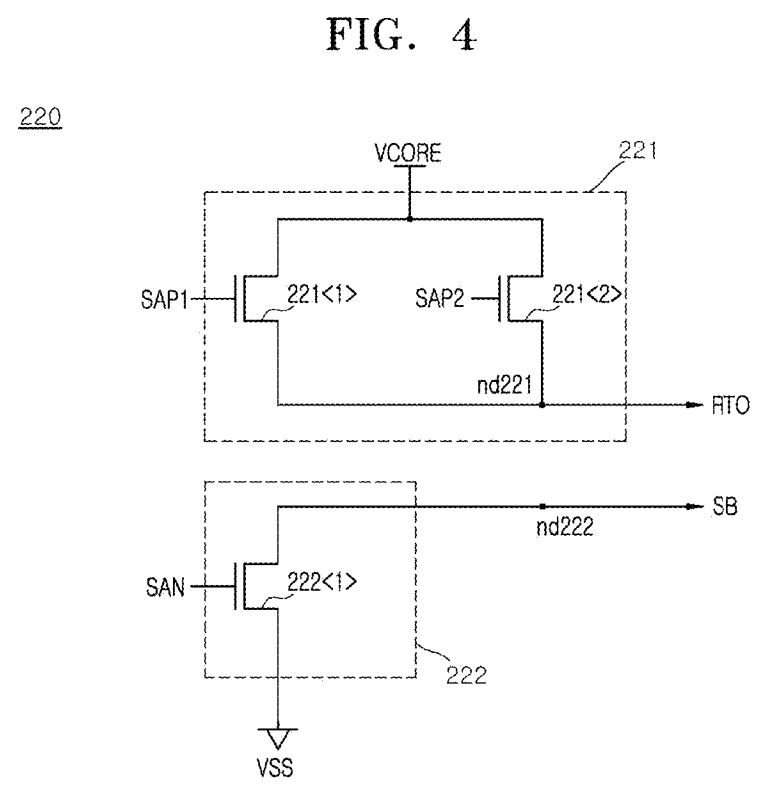

FIG. 4 is a circuit diagram illustrating an embodiment of the voltage generation circuit 220, for example, as included in the voltage control circuit 200 shown in FIG. 3. The voltage generation circuit 220 includes a first drive circuit 221 and a second drive circuit 222.

The first drive circuit 221 is implemented with a first driver 221<1> disposed between the core voltage VCORE and a first node nd221 and a second driver 221<2> disposed between the core voltage VCORE and the first node nd221 in the example of FIG. 4. The first driver 221<1> drives the first node nd221 to the core voltage VCORE to generate the first supply voltage RTO when the first drive signal SAP1 is enabled. The second driver 221<2> drives the first node nd221 to the core voltage VCORE to generate the first supply voltage RTO when the second drive signal SAP2 is enabled. Each of the first driver 221<1> and the second driver 221<2> are implemented with an NMOS transistor in this example, although other types of transistors may be utilized. The first supply voltage RTO may be generated at a voltage level of the pre-charge voltage VBLP when the first drive signal SAP1 and the second drive signal SAP2 are disabled. Although the first drive circuit 221 is implemented to drive the first supply voltage RTO to the core voltage VCORE when the first drive signal SAP1 and the second drive signal SAP2 are enabled, the first drive circuit 221 may be implemented to drive the first supply voltage RTO to the pre-charge voltage VBLP when the first drive signal SAP1 and the second drive signal SAP2 are disabled.

The second drive circuit 222 is implemented with a third driver 222<1> disposed between a second node nd222 and the ground voltage VSS in the example of FIG. 4. The third driver 222<1> drives the second node nd222 to the ground voltage VSS to generate the second supply voltage SB when the third drive signal SAN is enabled. The third driver 222<1> is implemented with an NMOS transistor in this example, although other types of transistors may be utilized. The second supply voltage SB may be generated at the voltage level of the pre-charge voltage VBLP when the third drive signal SAN is disabled. Although the second drive circuit 222 is implemented to drive the second supply voltage SB to the ground voltage VSS when the third drive signal SAN is enabled, the second drive circuit 222 may be implemented to drive the second supply voltage SB to the pre-charge voltage VBLP when the third drive signal SAN is disabled FIG. 5 is a circuit diagram illustrating an embodiment of the sense amplifier 300, for example, as included in the semiconductor device 1 shown in FIG. 1. The sense amplifier 300 includes a compensation circuit 310, a sensing connection circuit 320, a first amplification circuit 330, a second amplification circuit 340, and an equalization circuit 350.

Figure 5:
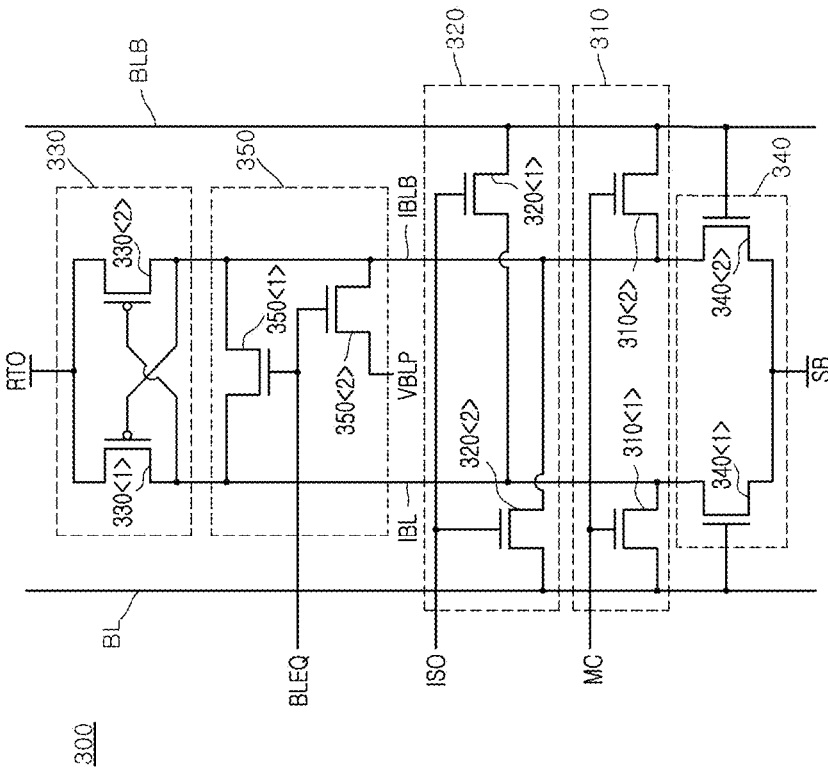
FIG. 5 is a circuit diagram illustrating an embodiment of a sense amplifier of a semiconductor device.

The compensation circuit 310 is implemented with an NMOS transistor 310<1> connected between the bit line BL and an internal bit line IBL and an NMOS transistor 310<2> connected between the inverted bit line BLB and an internal inverted bit line IBLB in the example of FIG. 5. The compensation circuit 310 connects the internal bit line IBL to the bit line BL, which are driven to the first supply voltage RTO at the first setting level when the matching control signal MC is enabled at a logic "high" level. The compensation circuit 310 connects the internal inverted bit line IBLB to the inverted bit line BLB, which are driven to the first supply voltage RTO at the first setting level, when the matching control signal MC is enabled at a logic "high" level. The compensation circuit 310 drives the bit line BL and the inverted bit line BLB to the first supply voltage RTO at the first setting level to drive the bit line BL and the inverted bit line BLB to the same voltage level when the matching control signal MC is enabled at a logic "high" level.

The sensing connection circuit 320 is implemented with an NMOS transistor 320<1> connected between the inverted bit line BLB and the internal bit line IBL and an NMOS transistor 320<2> connected between the bit line BL and the internal inverted bit line IBLB in the example of FIG. 5. The sensing connection circuit 320 connects the inverted bit line BLB and the internal bit line IBL to each other when the sense amplifier drive signal ISO is enabled at a logic "high" level. The sensing connection circuit 320 connects the bit line BL to the internal inverted bit line IBLB when the sense amplifier drive signal ISO is enabled at a logic "high" level.

The first amplification circuit 330 is implemented with a PMOS transistor 330<1> connected between the first supply voltage RTO and the internal bit line IBL and driving the internal bit line IBL depending on a voltage level of the internal inverted bit line IBLB and a PMOS transistor 330<2> connected between the first supply voltage RTO and the internal inverted bit line IBLB and driving the internal inverted bit line IBLB depending on the voltage level of the internal bit line IBL in the example of FIG. 5.

The second amplification circuit 340 is implemented with an NMOS transistor 340<1> connected between the second supply voltage SB and the internal bit line IBL and driving the internal bit line IBL depending on the voltage level of the bit line BL and an NMOS transistor 340<2> connected between the second supply voltage SB and the internal inverted bit line IBLB and driving the internal inverted bit line IBLB depending on the voltage level of the inverted bit line BLB in the example of FIG. 5.

The equalization circuit 350 is implemented with an NMOS transistor 350<1> connected between the internal bit line IBL and the internal inverted bit line BLB and an NMOS transistor 350<2> connected between the pre-charge voltage VBLP and the internal inverted bit line IBLB in the example of FIG. 5. The equalization circuit 350 connects the internal bit line IBL to the internal inverted bit line IBLB and drives the internal bit line IBL and the internal inverted bit line IBLB to the pre-charge voltage VBLP when the equalization signal BLEQ is enabled at a logic "high" level.

With reference to FIG. 5, the mismatch cancellation operation, the sensing operation, and the pre-charge operation of the sense amplifier 300 are described as follows.

During the mismatching cancellation operation, the compensation circuit 310 of the sense amplifier 300 connects the internal bit line IBL and the bit line BL that are driven to the first supply voltage RTO having the first setting level when the matching control signal MC is enabled at a logic "high" level. The compensation circuit 310 connects the internal inverted bit line IBLB and the inverted bit line BLB that are driven to the first supply voltage RTO at the first setting level (core voltage VCORE) when the matching control signal MC is enabled at a logic "high" level. The compensation circuit 310 drives the bit line BL and the inverted bit line BLB to the first supply voltage RTO at the first setting level (core voltage VCORE) to drive the bit line BL and the inverted bit line BLB to the same voltage level when the matching control signal MC is enabled at a logic "high" level.

During the sensing operation, the sensing connection circuit 320 of the sense amplifier 300 connects the inverted bit line BLB to the internal bit line IBL when the sense amplifier drive signal ISO is enabled at a logic "high" level. The sensing connection circuit 320 connects the bit line BL to the internal inverted bit line IBLB when the sense amplifier drive signal ISO is enabled at a logic "high" level. When the voltage level of the internal inverted bit line IBLB is low, the first amplification circuit 330 and the second amplification circuit 340 of the sense amplifier 300 gradually increases the voltage level of the internal bit line IBL by increasing the driving power of the PMOS transistor 330<1> that drives the internal bit line IBL. When the voltage level of the internal bit line IBL is low, the first amplification circuit 330 and the second amplification circuit 340 gradually increase the voltage level of the internal inverted bit line IBLB by increasing the driving power of the PMOS transistor 330<2> that drives the internal inverted bit line IBLB. Thus, the sense amplifier 300 performs the sensing and amplification operations that gradually increase the voltage level of the inverted bit line BLB when the voltage level of the bit line BL is lower than the voltage level of the inverted bit line BLB. The sense amplifier 300 performs the sensing and amplification operations that gradually increase the voltage level of the bit line BL when the voltage level of the inverted bit line BLB is lower than the voltage level of the bit line BL.

During the pre-charge operation, the sensing connection circuit 320 of the sense amplifier 300 connects the inverted bit line BLB to the internal bit line IBL when the sense amplifier drive signal ISO is enabled at a logic "high" level. The sensing connection circuit 320 connects the bit line BL to the internal inverted bit line IBLB when the sense amplifier drive signal ISO is enabled at a logic "high" level. The equalization circuit 350 of the sense amplifier 300 connects the internal bit line IBL to the internal inverted bit line IBLB and drives the internal bit line IBL and the internal inverted bit line IBLB to the pre-charge voltage VBLP when the equalization signal BLEQ is enabled at a logic "high" level. During the pre-charge operation, the sense amplifier 300 drives the bit line BL and the inverted bit line BLB to the pre-charge voltage VBLP.

Figure 6:
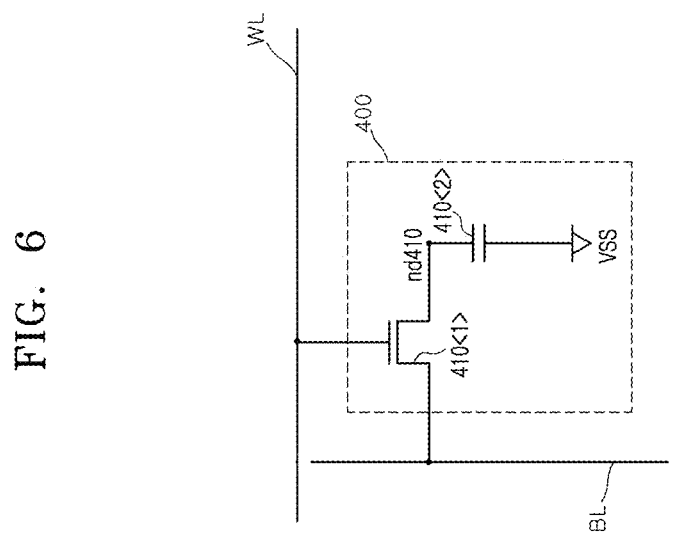

FIG. 6 is a circuit diagram illustrating an embodiment of the memory cell 400, for example, as included in the semiconductor device 1 shown in FIG. 1.

The memory cell 400 is implemented with an NMOS transistor 410<1> connected between the bit line BL and a storage node nd410 and a capacitor 410<2> connected between the storage node nd410 and the ground voltage VSS in the example of FIG. 6. The NMOS transistor 410<1> is turned on when the word line WL is activated at the high voltage VPP level to connect the bit line BL to the storage node nd410. The capacitor 410<2> stores the charge of the storage node nd410.

In the memory cell 400, when the word line WL is activated at the high voltage VPP level, the NMOS transistor 410<1> is turned on, such that the charge of the bit line BL and the charge of the storage node nd410 are shared. The memory cell 400 inputs and outputs data (not shown) by sharing the charge of the bit line BL and the charge of the storage node nd410.

Figure 7:
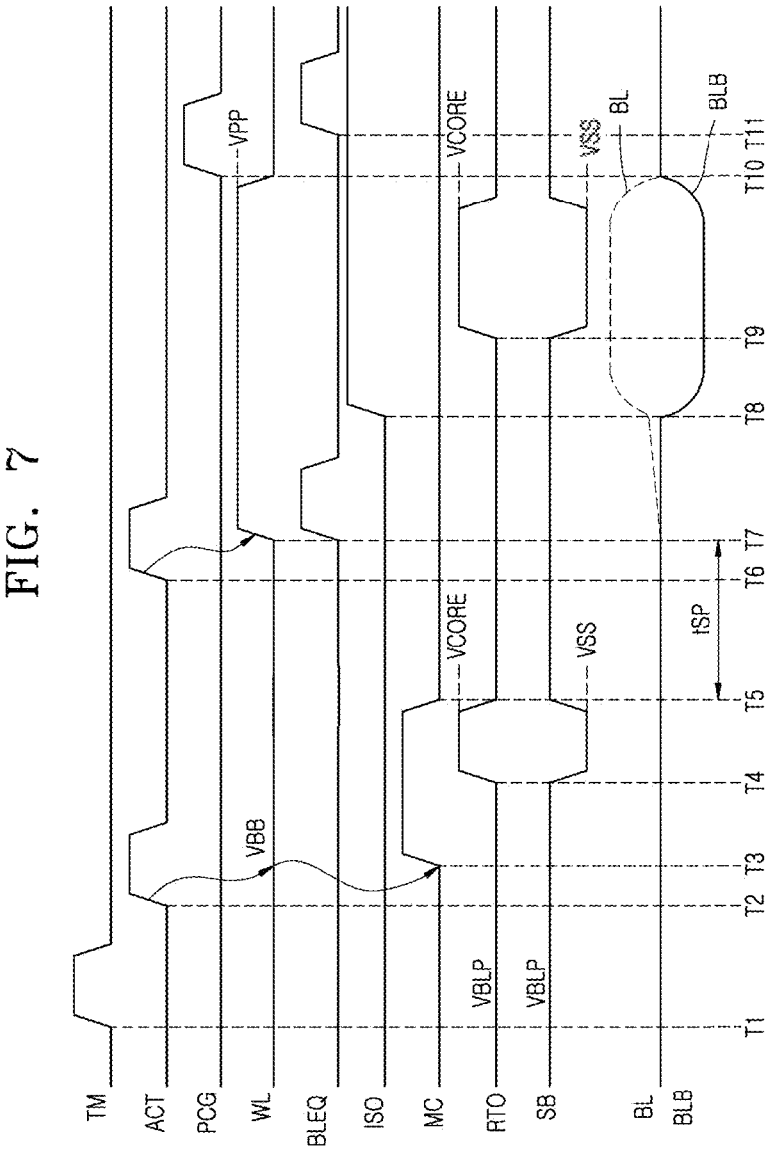
FIG. 7 and FIG. 8 are timing diagrams during an operation of a semiconductor device according to an embodiment of the present disclosure.
Figure 8:
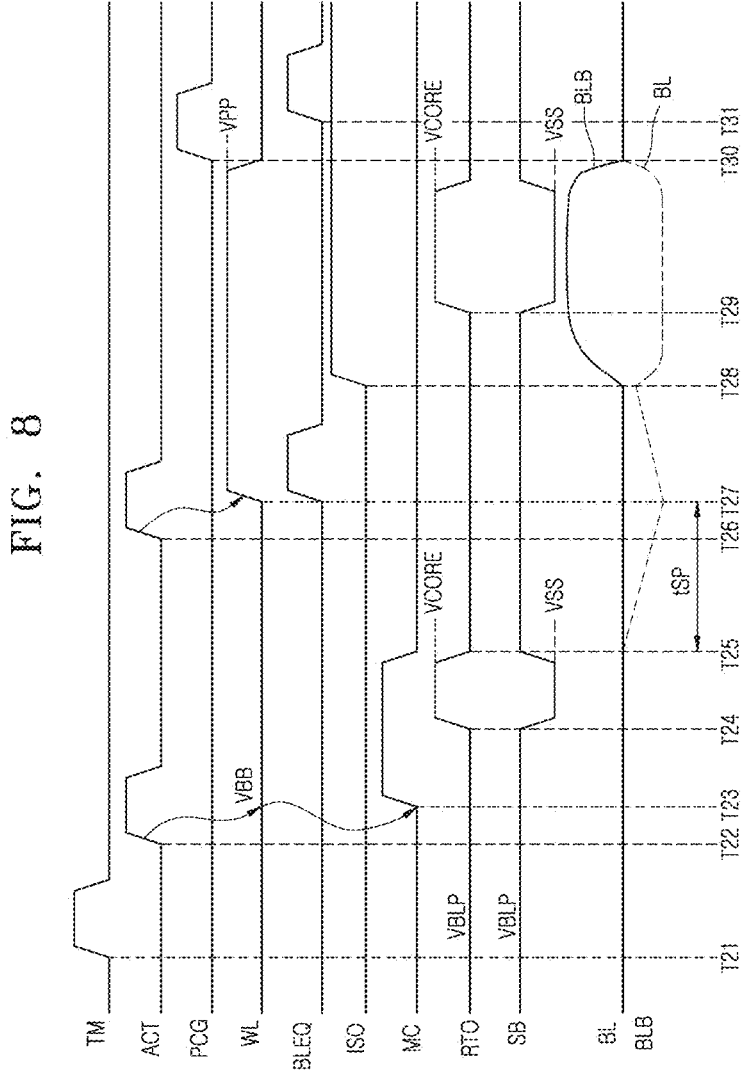

FIG. 7 and FIG. 8 are timing diagrams during an operation of the semiconductor device 1 according to an embodiment of the present disclosure. The operation of the semiconductor device 1 according to an embodiment of the present disclosure is described with reference to the timing diagram of FIG. 7 and FIG. 1 through FIG. 6. An example where the word line WL is physically and electrically blocked or isolated from the bit line BL during the test mode and no connection defect is present is described as follows.

At time T1, the test command TM is input to initiate or enable the test mode.

At time T2, the first active command ACT is input to initiate the first active operation.

The voltage generation circuit 220 of the voltage control circuit 200 generates the first supply voltage RTO and second supply voltage SB at the voltage level of the second setting level (pre-charge voltage VBLP) when the first drive signal SAP1, the second drive signal SAP2, and the third drive signal SAN are disabled.

At time T3, the word line drive circuit 110 of the control circuit 100 drives the word line WL to the back bias voltage VBB to deactivate the word line WL after the test command TM initiates the test mode and in response to input of the first active command ACT. The sense amplifier control circuit 120 generates the matching control signal MC as enabled at a logic "high" level in response to input of the first active command ACT.

At time T4, the drive signal generation circuit 210 of the voltage control circuit 200 generates the first drive signal SAP1, the second drive signal SAP2, and the third drive signal SAN as enabled in response to input of the first active command ACT at time T2, in other words, during the first active operation. The voltage generation circuit 220 generates the first supply voltage RTO at a voltage level of the first setting level (core voltage VCORE) and the second supply voltage SB at a voltage level of the third setting level (ground voltage VSS) when the first drive signal SAP1, the second drive signal SAP2, and the third drive signal SAN are enabled at time T4.

The compensation circuit 310 of the sense amplifier 300 connects the internal bit line IBL to the bit line BL, which are driven to the first supply voltage RTO at the first setting level when the matching control signal MC is enabled at a logic "high" level. The compensation circuit 310 connects the internal inverted bit line IBLB to the inverted bit line BLB, which are driven to the first supply voltage RTO at the first setting level (core voltage VCORE) when the matching control signal MC is enabled at a logic "high" level. The compensation circuit 310 drives the bit line BL and the inverted bit line BLB to the first supply voltage RTO at the first setting level (core voltage VCORE) to drive the bit line BL and the inverted bit line BLB to the same voltage level when the matching control signal MC is enabled at a logic "high" level.

At time T5, the drive signal generation circuit 210 of the voltage control circuit 200 generates the first drive signal SAP1, the second drive signal SAP2, and the third drive signal SAN as disabled. The voltage generation circuit 220 generates the first supply voltage RTO and second supply voltage SB at the voltage level of the second setting level (pre-charge voltage VBLP) when the first drive signal SAP1, the second drive signal SAP2, and the third drive signal SAN are disabled.

When the word line WL is physically and electrically blocked or isolated from the bit line BL and no connection defect is present, the voltage level of the bit line BL is maintained at the voltage level of the pre-charge voltage VBLP during the settling period tSP T5 through T7.

At time T6, the second active command ACT is input to initiate the second active operation.

At time T7, the word line drive circuit 110 of the control circuit 100 drives the word line WL to the high voltage VPP to activate the word line WL in response to input of the second active command ACT. Thus, the word line drive circuit 110 of the control circuit 100 activates the word line WL at time T7 when the settling period tSP elapses during the test mode.

In the memory cell 400, when the word line WL is activated at the voltage level of the high voltage VPP, the NMOS transistor 410<1> s turned on, and the charge of the bit line BL and the charge of the storage node nd410 are shared.

The sense amplifier control circuit 120 generates the matching control signal MC as disabled at a logic "low" level when the settling period tSP begins at T5. The sense amplifier control circuit 120 generates the equalization signal BLEQ as enabled at a logic "high" level in response to input of the second active command ACT.

The equalization circuit 350 of the sense amplifier 300 connects the internal bit line IBL to the internal inverted bit line IBLB and drives the internal bit line IBL and the internal inverted bit line IBLB to the pre-charge voltage VBLP when the equalization signal BLEQ is enabled at a logic "high" level.

At time T8, the sense amplifier control circuit 120 of the control circuit 100 generates the sense amplifier drive signal ISO as enabled at a logic "high" level in response to the second active command ACT input at time T6 and after enabling or inputting the equalization signal BLEQ.

The sensing connection circuit 320 of the sense amplifier 300 connects the inverted bit line BLB to the internal bit line IBL when the sense amplifier drive signal ISO is enabled at a logic "high" level. The sensing connection circuit 320 connects the bit line BL to the internal inverted bit line IBLB when the sense amplifier drive signal ISO is enabled at a logic "high" level.

At time T9, the drive signal generation circuit 210 of the voltage control circuit 200 generates the first drive signal SAP1, the second drive signal SAP2, and the third drive signal SAN as enabled in response to input of the second active command ACT at time T6. The voltage generation circuit 220 generates the first supply voltage RTO at the voltage level of the first setting level (core voltage VCORE) and the second supply voltage SB at the voltage level of the third setting level (ground voltage VSS) when the first drive signal SAP1, the second drive signal SAP2, and the third drive signal SAN are enabled.

The first amplification circuit 330 and the second amplification circuit 340 of the sense amplifier 300 receive the first supply voltage RTO at the voltage level of the first setting level (core voltage VCORE) and the second supply voltage SB at the voltage level of the third setting level (ground voltage VSS) and gradually increase the voltage level of the internal inverted bit line IBLB by increasing the drive power of the PMOS transistor 330<2> that drives the internal inverted bit line IBLB when the voltage level of the internal bit line IBL is low.

Thus, when the voltage level of the inverted bit line BLB is lower than the voltage level of the bit line BL, the sense amplifier 300 performs the sensing and amplifying operations including gradually increasing the voltage level of the bit line BL and gradually decreasing the voltage level of the inverted bit line BLB.

In this example, when the voltage level of the bit line BL is generated at the voltage level of the core voltage VCORE and the voltage level of the inverted bit line BLB is generated at the voltage level of the ground voltage VSS, the detection circuit 500 detects that the word line WL is physically and electrically blocked or isolated from the bit line BL and no connection defect is present.

At time T10, the pre-charge command PCG is input.

At time T11, the sense amplifier control circuit 120 generates the equalization signal BLEQ as enabled in response to input of the pre-charge command PCG.

The equalization circuit 350 of the sense amplifier 300 connects the internal bit line IBL to the internal inverted bit line IBLB and drives the internal bit line IBL and the internal inverted bit line IBLB to the pre-charge voltage VBLP when the equalization signal BLEQ is enabled at a logic "high" level.

The sensing connection circuit 320 of the sense amplifier 300 connects the inverted bit line BLB to the internal bit line IBL when the sense amplifier drive signal ISO is enabled at a logic "high" level. The sensing connection circuit 320 connects the bit line BL to the internal inverted bit line IBLB when the sense amplifier drive signal ISO is enabled at a logic "high" level.

Thus, the sense amplifier 300 performs the pre-charge operation including driving the voltage levels of the bit line BL and the inverted bit line BLB to the voltage level of the pre-charge voltage VBLP.

As described above, the semiconductor device 1 according to an embodiment of the present disclosure performs the mismatching cancellation operation by deactivating the word line WL during the first active operation during the test mode. The semiconductor device 1 might not perform the sensing operation after performing the mismatching cancellation operation during the test mode. The semiconductor device 1 detects the connection defects between the word line WL and the bit line BL by blocking the connection between the bit line BL and the inverted bit line BLB during the settling period after performing the mismatching cancellation operation and detecting the voltage levels of the bit line BL and the inverted bit line BLB during the second active operation.

The operation of the semiconductor device 1 according to an embodiment of the present disclosure is described with reference to the timing diagram of FIG. 8 and FIG. 2 through FIG. 6. An example where the word line WL and the bit line BL are physically and electrically connected and a connection defect occurs during the test mode is described as follows.

At time T21, the test command TM is input to initiate or enable the test mode.

At time T22, the first active command ACT is input to initiate the first active operation.

The voltage generation circuit 220 of the voltage control circuit 200 generates the first supply voltage RTO and the second supply voltage SB at the voltage level of the second setting level (pre-charge voltage VBLP) when the first drive signal SAP1, the second drive signal SAP2, and the third drive signal SAN are disabled.

At time T23, the word line drive circuit 110 of the control circuit 100 drives the word line WL to the back bias voltage VBB to deactivate the word line WL after the test command TM that initiates the test mode and in response to input of the first active command ACT. The sense amplifier control circuit 120 generates the matching control signal MC as enabled at a logic "high" level in response to input of the first active command ACT.

At time T24, the drive signal generation circuit 210 of the voltage control circuit 200 generates the first drive signal SAP1, the second drive signal SAP2, and the third drive signal SAN as enabled in response to input of the first active command ACT input at time T22. The voltage generation circuit 220 generates the first supply voltage RTO at the voltage level of the first setting level (core voltage VCORE) and the second supply voltage SB at the voltage level of the third setting level (ground voltage VSS) when the first drive signal SAP1, the second drive signal SAP2, and the third drive signal SAN are enabled at time T24.

The compensation circuit 310 of the sense amplifier 300 connects the internal bit line IBL to the bit line BL, which are driven to the first supply voltage RTO at the first setting level when the matching control signal MC is enabled at a logic "high" level. The compensation circuit 310 connects the internal inverted bit line IBLB to the inverted bit line BLB, which are driven to the first supply voltage RTO at the first setting level (core voltage VCORE) when the matching control signal MC is enabled at a logic "high" level. The compensation circuit 310 drives the bit line BL and the inverted bit line BLB to the first supply voltage RTO at the first setting level (core voltage VCORE) to drive the bit line BL and the inverted bit line BLB to the same voltage level when the matching control signal MC is enabled at a logic "high" level.

At time T25, the drive signal generation circuit 210 of the voltage control circuit 200 generates the first drive signal SAP1, the second drive signal SAP2, and the third drive signal SAN as disabled. The voltage generation circuit 220 generates the first supply voltage RTO and the second supply voltage SB at the voltage level of the second setting level (pre-charge voltage VBLP) when the first drive signal SAP1, the second drive signal SAP2, and the third drive signal SAN are disabled.

When the word line WL and the bit line BL are physically and electrically connected resulting in a connection defect, the word line WL is driven to the back bias voltage VBB, such that the voltage level of the bit line BL gradually decreases from the pre-charge voltage VBLP during the settling period tSP T25 through T27.

At time T26, the second active command ACT is input to initiate the second active operation.

At time T27, the word line drive circuit 110 of the control circuit 100 drives the word line WL to the high voltage VPP to activate the word line WL in response to input of the second active command ACT. Thus, the word line drive circuit 110 of the control circuit 100 activates the word line WL at time T27 when the settling period tSP elapses during the test mode.

In the memory cell 400, when the word line WL is activated at the high voltage VPP level, the NMOS transistor 410<1> is turned on, and the charge of the bit line BL and the charge of the storage node nd410 are shared.

The sense amplifier control circuit 120 generates the matching control signal MC as disabled at a logic "low" level when the settling period tSP begins at T25. The sense amplifier control circuit 120 generates the equalization signal BLEQ as enabled at a logic "high" level in response to input of the second active command ACT.

The equalization circuit 350 of the sense amplifier 300 connects the internal bit line IBL to the internal inverted bit line IBLB and drives the internal bit line IBL and the internal inverted bit line IBLB to the pre-charge voltage when the equalization signal BLEQ is enabled at a logic "high" level.

At time T28, the sense amplifier control circuit 120 of the control circuit 100 generates the sense amplifier drive signal ISO as enabled at a logic "high" level in response to the second active command ACT input at time T26 and after enabling or inputting the equalization signal BLEQ.

The sensing connection circuit 320 of the sense amplifier 300 connects the inverted bit line BLB to the internal bit line IBL when the sense amplifier drive signal ISO is enabled at a logic "high" level. The sensing connection circuit 320 connects the bit line BL to the internal inverted bit line IBLB when the sense amplifier drive signal ISO is enabled at a logic "high" level.

Between time T25 and time T28, the voltage level of the bit line BL is generated lower than the voltage level of the pre-charge voltage VBLP.

At time T29, the drive signal generation circuit 210 of the voltage control circuit 200 generates the first drive signal SAP1, the second drive signal SAP2, and the third drive signal SAN as enabled in response to input of the second active command ACT at time T26. The voltage generation circuit 220 generates the first supply voltage RTO at the voltage level of the first setting level (core voltage VCORE) and the second supply voltage SB at the voltage level of the third setting level (ground voltage VSS) when the first drive signal SAP1, the second drive signal SAP2, and the third drive signal SAN are enabled.

The first amplification circuit 330 and the second amplification circuit 340 of the sense amplifier 300 receive the first supply voltage RTO at the voltage level of the first setting level (core voltage VCORE) and the second supply voltage SB at the voltage level of the third setting level (ground voltage VSS) and gradually increase the voltage level of the internal bit line IBL by increasing the driving power of the PMOS transistor 330<1> that drives the internal bit line IBL when the voltage level of the internal inverted bit line IBLB is low.

Thus, the sense amplifier 300 performs the sensing and amplifying operations including gradually increasing the voltage level of the inverted bit line BLB and gradually decreasing the voltage level of the bit line BL when the voltage level of the bit line BL is lower than the voltage level of the inverted bit line BLB.

In this example, when the voltage level of the bit line BL is generated at the voltage level of the ground voltage VSS and the voltage level of the inverted bit line BLB is generated at the voltage level of the core voltage VCORE, the detection circuit 500 detects that the word line WL and the bit line BL are physically and electrically connected resulting in a connection defect.

At time T30, the pre-charge command PCG is input.

At time T31, the sense amplifier control circuit 120 generates the equalization signal BLEQ as enabled in response to input of the pre-charge command PCG.

The equalization circuit 350 of the sense amplifier 300 connects the internal bit line IBL to the internal inverted bit line IBLB and drives the internal bit line IBL and the internal inverted bit line IBLB to the pre-charge voltage VBLP when the equalization signal BLEQ is enabled at a logic "high" level.

The sensing connection circuit 320 of the sense amplifier 300 connects the inverted bit line BLB to the internal bit line IBL when the sense amplifier drive signal ISO is enabled at a logic "high" level. The sensing connection circuit 320 connects the bit line BL to the internal inverted bit line IBLB when the sense amplifier drive signal ISO is enabled at a logic "high" level.

Thus, the sense amplifier 300 performs the pre-charge operation including driving the voltage levels of the bit line BL and the inverted bit line BLB to the voltage level of the pre-charge voltage VBLP.

As described above, the semiconductor device 1, according to an embodiment of the present disclosure, deactivates the word line WL to perform the mismatching cancellation operation during the first active operation during the test mode. The semiconductor device 1 might not perform the sensing operation after performing the mismatching cancellation operation during the test mode. The semiconductor device 1 detects the connection defects between the word line WL and the bit line BL by blocking the connection between the bit line BL and the inverted bit line BLB during the settling period after performing the mismatching cancellation operation and sensing the voltage levels of the bit line BL and the inverted bit line BLB during the second active operation. Defects between the word line WL and the bit line BL may cause crosstalk and other operational issues that may result in data errors and inefficient data operations.

Figure 9:
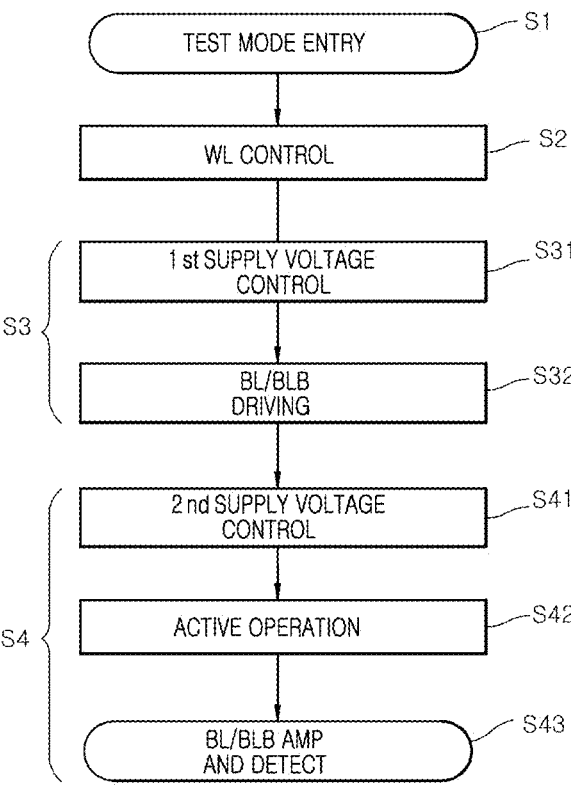
FIG. 9 is a flowchart illustrating a test method of a semiconductor device according to an embodiment of the present disclosure.

FIG. 9 is a flowchart illustrating a test method of the semiconductor device 1 in FIG. 1 according to an embodiment of the present disclosure. Referring to FIG. 9 and FIG. 1, the test method of the semiconductor device 1 according to an embodiment of the present disclosure includes test mode entry S1, word line control S2, mismatching cancellation S3, and defect detection S4.

The test mode entry S1 includes inputting or enabling the test command TM to enter the test mode.

Word line control S2 includes, after entering the test mode, deactivating the word line WL during a first active operation. Word line control S2 includes deactivating the word line WL during the test mode in response to enabling or input of the first active command ACT that initiates performing the first active operation.

During word line control S2, the control circuit 100 drives the word line to a back bias voltage VBB to deactivate the word line WL during the test mode and in response to enabling or input of the first active command ACT.

Mismatching cancellation S3, also referred to as the mismatching cancellation operation, includes: disabling the sense amplifier drive signal ISO, generating the first supply voltage RTO at a first setting level (core voltage VCORE), and generating the second supply voltage SB at a third setting level (ground voltage VSS) to drive the bit line BL and the inverted bit line BLB to the same voltage level.

Mismatching cancellation S3 includes first supply voltage control S31 and bit line pair driving S32.

First supply voltage control S31 includes generating the first supply voltage RTO at the first setting level (core voltage VCORE) and generating the second supply voltage SB at the third setting level (ground voltage VSS) after generating the first supply voltage RTO and second supply voltage SB at a second setting level (pre-charge voltage VBLP).

During first supply voltage control S31, the voltage control circuit 200 generates the first supply voltage RTO and second supply voltage SB at the voltage level of the second setting level (pre-charge voltage VBLP) prior to input of the first active command ACT, and generates the first supply voltage RTO at the voltage level of the first setting level (core voltage VCORE) and the second supply voltage SB at the voltage level of the third setting level (ground voltage VSS) in response to enabling the first active command ACT.

Bit line pair driving S32 includes receiving the first supply voltage RTO at the first setting level (core voltage VCORE) and the second supply voltage SB at the third setting level (ground voltage VSS) to drive the bit line BL and the inverted bit line BLB to the same voltage level when the matching control signal MC is enabled during the mismatching cancellation operation. Bit line pair driving S32 includes blocking or isolating the connection of the bit line BL and the inverted bit line BLB during a settling period that occurs after the mismatching cancellation operation.

During bit line pair driving S32, the control circuit 100 generates the matching control signal MC as enabled in response to enabling of the first active command ACT during the test mode. During bit line pair driving S32, the sense amplifier 300 receives the first supply voltage RTO at the voltage level of the first setting level (core voltage VCORE) and the second supply voltage SB at the voltage level of the third setting level (ground voltage VSS) to drive the bit line BL and the inverted bit line BLB to the same voltage level when the matching control signal MC is enabled. During bit line pair driving S32, the sense amplifier 300 blocks the connection of the bit line BL and the inverted bit line BLB during the settling period after the mismatching cancellation operation ends.

Defect detecting S4 includes generating the first supply voltage RTO and the second supply voltage SB at the second setting level (pre-charge voltage VBLP), sensing and amplifying the voltage difference between the bit line BL and the inverted bit line BLB, and sensing the voltage level of the bit line BL and the inverted bit line BLB to detect any connection defects between the word line WL and the bit line BL.

Defect detection S4 includes second supply voltage control S41, an active operation S42, and bit line pair amplifying and sensing S43.

Second supply voltage control S41 includes generating the first supply voltage RTO at the first setting level (core voltage VCORE), generating the second supply voltage SB at the third setting level (ground voltage VSS), and subsequently generating the first supply voltage RTO and the second supply voltage SB at the second setting level (precharge voltage VBLP).

During second supply voltage control S41, the voltage control circuit 200 generates the first supply voltage RTO at the first setting level (core voltage VCORE) and at the voltage level of the second setting level (pre-charge voltage VBLP). During second supply voltage control S41, the voltage control circuit 200 generates the second supply voltage SB at the third setting level (ground voltage VSS) and at the voltage level of the second setting level (precharge voltage VBLP).

The second active operation S42 includes activating the word line WL in response to input of the second active command ACT that initiates performing the second active operation S42.

During the second active operation S42, the control circuit 100 drives the word line WL to the high voltage VPP to activate the word line WL in response to enabling or input of the second active command ACT.

Bit line pair amplifying and sensing S43 includes sensing and amplifying the voltage difference between the bit line BL and the inverted bit line BLB when the word line WL is activated and sensing the voltage levels of the bit line BL and the inverted bit line BLB to detect any connection defects between the bit line BL and the word line WL.

During bit line pair amplifying and sensing S43, in the memory cell 400, when the word line WL is activated at the voltage level of the high voltage VPP, the NMOS transistor 410<1> is turned on, such that the charge of the bit line BL and the charge of the storage node (nd410 in FIG. 6) are shared. During bit line pair amplifying and sensing S43, the control circuit 100 generates the sense amplifier drive signal ISO as enabled during the second active operation after the second active command ACT is enabled. During bit line pair amplifying and sensing S43, the voltage control circuit 200 generates the first supply voltage RTO at the voltage level of the first setting level (core voltage VCORE) and the second supply voltage SB at the voltage level of the third setting level (ground voltage VSS) during the second active operation after the second active command ACT is enabled. During bit line pair amplifying and sensing S43, the sense amplifier 300 receives the first supply voltage RTO at the voltage level of the first setting level (core voltage VCORE) and the second supply voltage SB at the voltage level of the third setting level (ground voltage VSS) and senses and amplifies the voltage difference between the bit line BL and the inverted bit line BLB when the sense amplifier drive signal ISO is enabled during the sensing operation that occurs after the settling period. During bit line pair amplifying and sensing S43, the detection circuit 500 senses the voltage levels of the bit line BL and the inverted bit line BLB to detect the connection defects between the bit line BL and the word line WL. When the voltage level of the bit line BL is generated at the first setting level (core voltage VCORE) and the voltage level of the inverted bit line BLB is generated at the third setting level (ground voltage VSS) during the test mode, the detection circuit 500 detects that the word line WL is physically and electrically blocked or isolated from the bit line BL and no connection defect is present. When the voltage level of the bit line BL is generated at the third setting level (ground voltage VSS) and the voltage level of the inverted bit line BLB is generated at the first setting level (core voltage VCORE) during the test mode, the detection circuit 500 detects that the word line WL and the bit line BL are physically and electrically connected resulting in a connection defect.

As described above, according to the test method of the semiconductor device 1 according to an embodiment of the present disclosure, during the test mode, the word line WL is deactivated during the first active operation to perform the mismatching cancellation operation. During the test mode, the sensing operation might not be performed after performing the mismatching cancellation operation. According to the test method, the connection between the bit line BL and the inverted bit line BLB may be blocked during the settling period after performing the mismatching cancellation operation, and the voltage levels of the bit line BL and the inverted bit line BLB are sensed during the second active operation that detects the connection defects between the word line WL and the bit line BL.

Figure 10:
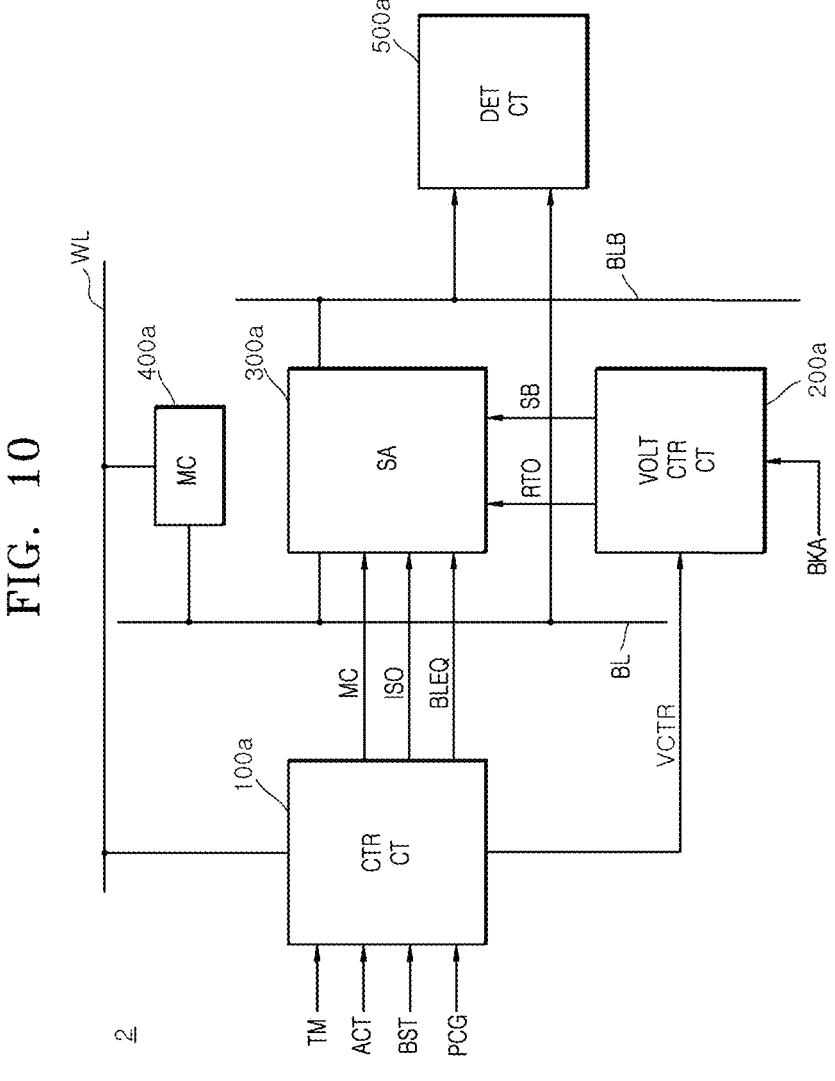
FIG. 10 is a block diagram illustrating a semiconductor device according to another embodiment of the present disclosure.

FIG. 10 is a block diagram illustrating a semiconductor device 2 according to another embodiment of the present disclosure. As shown in FIG. 10, the semiconductor device 2 includes a control circuit 100a, a voltage control circuit 200a, a sense amplifier 300a, a memory cell 400a, and a detection circuit 500a.

The control circuit 100a generates a matching control signal MC for performing a mismatching cancellation operation, a sense amplifier drive signal ISO for performing a sensing operation, and an equalization signal BLEQ for performing a pre-charge operation, based on a test command TM, an active command ACT, a burst command BST, and a pre-charge command PCG. The control circuit 100a deactivates a word line WL after the test command TM is input or enabled to enter the test mode and in response to enabling or input of the active command ACT. The control circuit 100a activates the word line WL during the test mode and when the burst command BST is enabled. The control circuit 100a generates a voltage control signal VCTR as enabled when the test command TM is input or enabled to enter the test mode and the active command ACT is enabled. The control circuit 100a generates a matching control signal MC as enabled when the active command ACT is enabled during the test mode. The control circuit 100a activates the word line WL during the test mode when the burst command BST is enabled after a settling period. The control circuit 100a generates the matching control signal MC as disabled during the test mode when the settling period begins. The control circuit 100a generates an equalization signal BLEQ and a sense amplifier drive signal ISO that are sequentially enabled during the test mode and in response to or when the burst command BST is enabled. The control circuit 100a generates the equalization signal BLEQ as enabled in response to input of the pre-charge command PCG. The test mode is an operation that detects connection defects between the word line WL and the bit line BL by blocking the connection between the bit line BL and the inverted bit line BLB and detecting when the voltage level of the bit line decreases relative to the voltage level of the word line WL during an active operation. The active command ACT is a command that is input as enabled to initiate performance of the active operation. The burst command BST is a command that is input as enabled to input/output of multiple data simultaneously by the active command ACT. The settling period is a time period during which the voltage level of the bit line BL is sufficiently reduced relative to the voltage level of the word line WL by blocking the connection between the bit line BL and the inverted bit line BLB after the mismatching cancellation operation. The settling period may be set to various different time periods depending on the embodiment.

During the mismatching cancellation operation, the voltage control circuit 200a generates a first supply voltage RTO at a voltage level of a core voltage (VCORE in FIG. 4) and a second supply voltage SB at a voltage level of the ground voltage (VSS in FIG. 4), and subsequently generates the first supply voltage RTO and second supply voltage SB at the voltage level of a pre-charge voltage (VBLP in FIG. 5). The voltage control circuit 200a generates the first supply voltage RTO and second supply voltage SB at the voltage level of the pre-charge voltage (VBLP in FIG. 5) in response to enabling the voltage control signal VCTR. The voltage control circuit 200a generates the first supply voltage RTO at the voltage level of the core voltage (VCORE in FIG. 4) and the second supply voltage SB at the voltage level of the ground voltage (VSS in FIG. 4) when the voltage control signal VCTR is disabled. The voltage control circuit 200a generates the first supply voltage RTO and second supply voltage SB at the voltage level of the pre-charge voltage (VBLP in FIG. 5) during the pre-charge operation. The core voltage (VCORE in FIG. 4) and the pre-charge voltage (VBLP in FIG. 5) may be voltages generated by reducing the power supply voltage supplied from outside the semiconductor device 2. The voltage level of the core voltage (VCORE in FIG. 4) may be higher than the voltage level of the pre-charge voltage (VBLP in FIG. 5). The ground voltage VSS may be a general or normal ground voltage. The voltage level of the core voltage (VCORE in FIG. 4) may be a first setting level. The voltage level of the pre-charge voltage (VBLP in FIG. 5) may be a second setting level. The voltage level of the ground voltage VSS may be a third setting level.

The sense amplifier 300a is connected between the bit line BL and an inverted bit line BLB in this embodiment. The sense amplifier 300a drives the bit line BL and the inverted bit line BLB to the same voltage level, based on the matching control signal MC during the mismatching cancellation operation. When the matching control signal MC is enabled, the sense amplifier 300a receives the first supply voltage RTO at the voltage level of the core voltage (VCORE in FIG. 4) and the second supply voltage SB at the voltage level of the ground voltage (VSS in FIG. 4) to drive the bit line BL and the inverted bit line BLB to the same voltage level. The sense amplifier 300a blocks the connection between the bit line BL and the inverted bit line BLB during the settling period. The sense amplifier 300a senses and amplifies the voltage difference between the bit line BL and the inverted bit line BLB in response to the sense amplifier drive signal ISO during the sensing operation after the settling period during the test mode. The sense amplifier 300a receives the first supply voltage RTO at the voltage level of the core voltage (VCORE in FIG. 4) and the second supply voltage SB at the voltage level of the ground voltage (VSS in FIG. 4) to sense and amplify the voltage difference between the bit line BL and the inverted bit line BLB when the word line WL is activated and the sense amplifier drive signal ISO is enabled during the sensing operation after the settling period during the test mode. The sense amplifier 300a drives the bit line BL and inverted bit line BLB to the voltage level of the pre-charge voltage (VBLP in FIG. 5) during the pre-charge operation during the test mode. The sense amplifier 300a receives the first supply voltage RTO and second supply voltage SB at the voltage level of the pre-charge voltage (VBLP in FIG. 5) to drive the bit line BL and inverted bit line BLB to the voltage level of the pre-charge voltage (VBLP in FIG. 5) when the equalization signal BLEQ is enabled during the pre-charge operation during the test mode. The sense amplifier 300a may be implemented with the same circuit as the sense amplifier 300 shown in FIG. 5 and perform similar operations as described above.

The memory cell 400a is connected to both the word line WL and the bit line BL. The memory cell 400a inputs/outputs data by sharing the charge of the bit line BL and the charge of the storage node (410 in FIG. 6) when the word line WL is activated. The memory cell 400a may be implemented with the same circuit as the memory cell 400 shown in FIG. 6 and perform similar operations as described above.

Although each of the sense amplifier 300a and the memory cell 400a is shown in FIG. 10 as a single component or structure, a plurality of sense amplifiers and/or a plurality of memory cells may be provided in the core region of a semiconductor device.

The detection circuit 500a senses the voltage levels of the bit line BL and the inverted bit line BLB to detect connection defects between the word line WL and the bit line BL, for example, during the sensing operation. When the voltage level of the bit line BL is generated at the voltage level of the core voltage VCORE and the voltage level of the inverted bit line BLB is generated at the voltage level of the ground voltage VSS, the detection circuit 500a detects that the word line WL is physically and electrically blocked or isolated from the bit line BL and no connection defect is present. When the voltage level of the bit line BL is generated at the voltage level of the ground voltage VSS and the voltage level of the inverted bit line BLB is generated at the voltage level of the core voltage VCORE, the detection circuit 500a detects that the word line WL and the bit line BL are physically and electrically connected when a connection defect occurs. Depending on the embodiment, the detection circuit 500a may be implemented to detect that the word line WL is physically and electrically blocked or isolated from the bit line BL and no connection defect is present when the voltage level of the bit line BL is generated at the voltage level of the ground voltage VSS and the voltage level of the inverted bit line BLB is generated at the voltage level of the core voltage VCORE during the test mode. Depending on the embodiment, the detection circuit 500a may be implemented to detect that the word line WL and the bit line BL are physically and electrically connected, and a connection defect occurs when the voltage level of the bit line BL is generated at the voltage level of the core voltage VCORE and the voltage level of the inverted bit line BLB is generated at the voltage level of the ground voltage VSS during the test mode.

The semiconductor device 2 deactivates the word line WL from the input time of the active command ACT to the input time of the burst command BST to perform the mismatching cancellation operation during the test mode. The semiconductor device 2 might not perform the sensing operation after performing the mismatching cancellation operation during the test mode. The semiconductor device 2 blocks the connection between the bit line BL and the inverted bit line BLB during the settling period after performing the mismatching cancellation operation and senses the voltage levels of the bit line BL and the inverted bit line BLB to detect the connection defects between the bit line BL and the word line WL.

Figure 11:
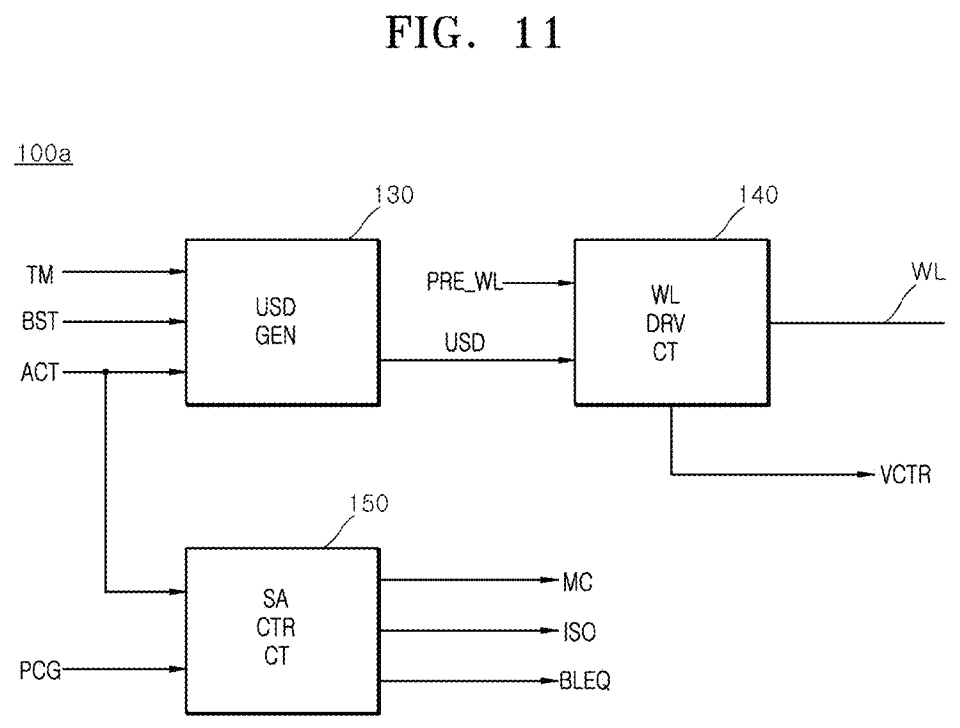

FIG. 11 is a block diagram illustrating an alternative embodiment of the control circuit 100a, for example, as included in the semiconductor device 2 shown in FIG. 10. The control circuit 100a includes a test control signal generation circuit 130, a word line drive circuit 140, and a sense amplifier control circuit 150.

The test control signal generation circuit 130 generates a test control signal USD, based on the test command TM, the active command ACT, and the burst command BST. The test control signal generation circuit 130 generates the test control signal USD as disabled at a logic "low" level when the test command TM that initiates or enters the test mode is disabled. The test control signal generation circuit 130 generates the test control signal USD as enabled from the time the active command ACT is enabled to the time the burst command BST is enabled when the test command TM is enabled.

The word line drive circuit 140 controls the word line WL, based on a pre-word line signal PRE_WL and the test control signal USD. The word line drive circuit 140 generates the voltage control signal VCTR based on the pre-word line signal PRE_WL and the test control signal USD. The word line drive circuit 140 deactivates the word line WL when the test control signal USD is enabled during the test mode. The word line drive circuit 140 drives the word line WL to a back bias voltage VBB to deactivate the word line WL while the test control signal USD is enabled. The word line drive circuit 140 generates the voltage control signal VCTR as enabled while the test control signal USD is enabled during the test mode. The word line drive circuit 140 activates the word line WL based on the pre-word line signal PRE_WL when the test control signal USD is disabled during the test mode. The word line drive circuit 140 drives the word line WL to a high voltage VPP to activate the word line WL based on the pre-word line signal PRE_WL when the test control signal USD is disabled. The back bias voltage VBB may be a voltage having a lower voltage level than the ground voltage VSS. The high voltage VPP may be a voltage having a higher voltage level than the ground voltage supplied from outside the semiconductor device 2. The back bias voltage VBB and the high voltage VPP may be voltages generated through a pumping circuit (not shown).

The sense amplifier control circuit 150 generates the matching control signal MC as enabled when the active command ACT is input. The sense amplifier control circuit 150 generates the equalization signal BLEQ and the sense amplifier drive signal ISO that are sequentially enabled when the active command ACT is input. The sense amplifier control circuit 150 generates the equalization BLEQ as enabled in response to input of the pre-charge command PCG.

Figure 12:
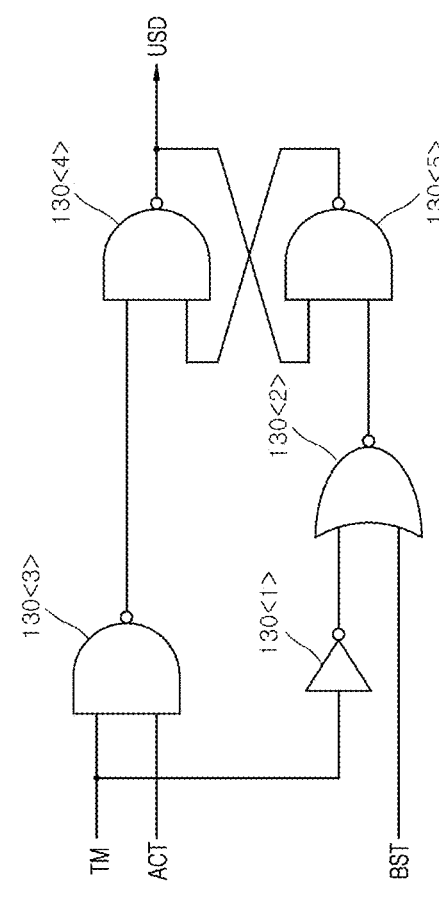
FIG. 12 is a circuit diagram illustrating an embodiment of a test control signal generation circuit of a control circuit.

FIG. 12 is a circuit diagram illustrating an embodiment of the test control signal generation circuit 130, for example, as included in the control circuit 100a shown in FIG. 11.

The test control signal generation circuit 130 is shown implemented with an inverter 130<1>, a NOR gate 130<2>, and NAND gates 130<3>, 130<4>, and 130<5> in this example. The test control signal generation circuit 130 generates the test control signal USD as disabled at a logic "low" level when the test command TM to enter the test mode is disabled at a logic "low" level. The test control signal generation circuit 130 generates the test control signal USD as enabled at a logic "high" level when the test command TM to enter the test mode is enabled at a logic "high" level and the active command ACT is enabled at a logic "high" level. The test control signal generation circuit 130 generates the test control signal USD as disabled at a logic "low" level when the test command TM to enter the test mode is enabled at a logic "high" level and the burst command BST is enabled at a logic "high" level. The test control signal generation circuit 130 generates the test control signal USD as enabled at a logic "high" level from the time the test command TM is enabled at a logic "high" level and the active command ACT is enabled to the time the burst command BST is enabled.

Figure 13:
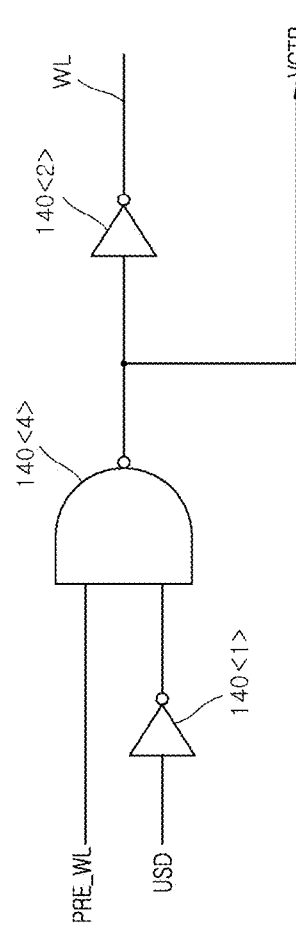
FIG. 13 is a circuit diagram illustrating an embodiment of a word line drive circuit of a control circuit.

FIG. 13 is a circuit diagram illustrating an embodiment of the word line drive circuit 140, for example, as included in the control circuit 100a shown in FIG. 11.

The word line drive circuit 140 is implemented with inverters 140<1> and 140<2> and a NAND gate 140<4> in the example of FIG. 13. The word line drive circuit 140 blocks the input of the pre-word line signal PRE_WL that is enabled at a logic "high" level during the active operation when the test control signal USD is enabled at a logic "high" level. The word line drive circuit 140 drives the word line WL to the back bias voltage VBB to deactivate the word line WL when the test control signal USD is enabled at a logic "high" level. The word line drive circuit 140 activates the word line WL when the test control signal USD is disabled at a logic "low" level and the pre-word line signal PRE_WL is enabled at a logic "high" level during the active operation. The word line drive circuit 140 drives the word line WL to the high voltage VPP to activate the word line WL when the test control signal USD is disabled at a logic "low" level and the pre-word line signal PRE_WL is enabled at a logic "high" level. The word line drive circuit 140 generates the voltage control signal VCTR that is enabled at a logic "high" level when the test control signal USD is enabled at a logic "high" level. The word line drive circuit 140 generates the voltage control signal VCTR that is disabled at a logic "low" level when the test control signal USD is disabled at a logic "low" level and the pre-word line signal PRE_WL is enabled at a logic "high" level.

Figure 14:
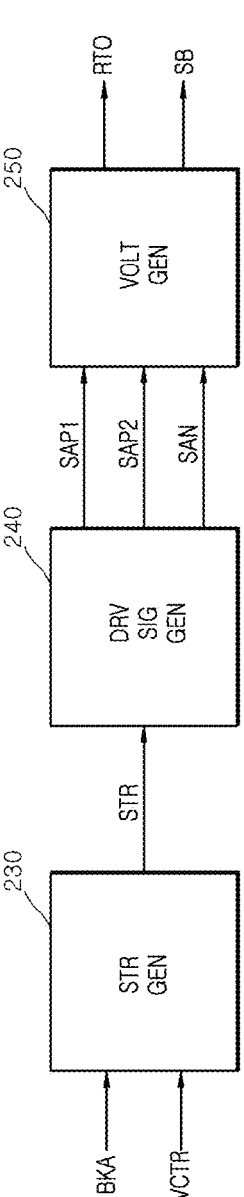
FIG. 14 is a block diagram illustrating an embodiment of a voltage control circuit of a semiconductor device.

FIG. 14 is a block diagram illustrating an embodiment of the voltage control circuit 200a, for example, as included in the semiconductor device 2 shown in FIG. 10. The voltage control circuit 200a includes a start signal generation circuit (STR GEN) 230, a drive signal generation circuit (DRV SIG GEN) 240, and a voltage generation circuit (VOLT GEN) 250.

The start signal generation circuit 230 generates a start signal STR based on a bank active signal BKA and the voltage control signal VCTR. The start signal generation circuit 230 blocks the input of the bank active signal BKA when the voltage control signal VCTR is enabled at a logic "high" level. The start signal generation circuit 230 generates the start signal STR as enabled when the voltage control signal VCTR is disabled at a logic "low" level and the bank active signal BKA is enabled at a logic "high" level during an active operation.

The drive signal generation circuit 240 generates the first drive signal SAP1, the second drive signal SAP2, and the third drive signal SAN as enabled when the start signal STR is enabled. The drive signal generation circuit 240 generates the first drive signal SAP1, the second drive signal SAP2, and the third drive signal SAN that include pulses generated when the start signal STR is enabled. The drive signal generation circuit 240 generates the first drive signal SAP1, the second drive signal SAP2, and the third drive signal SAN that are disabled when the start signal STR is disabled.

The voltage generation circuit 250 generates the first supply voltage RTO and the second supply voltage SB based on the first drive signal SAP1, the second drive signal SAP2, and the third drive signal SAN. The voltage generation circuit 250 may generate the first supply voltage RTO and second supply voltage SB at the voltage level of the pre-charge voltage (VBLP in FIG. 5) when the first drive signal SAP1, the second drive signal SAP2, and the third drive signal SAN are disabled. The voltage generation circuit 250 may generate the first supply voltage RTO and second supply voltage SB that are driven at the second setting level when the first drive signal SAP1, the second drive signal SAP2, and the third drive signal SAN are disabled. The voltage generation circuit 250 may generate the first supply voltage RTO at the voltage level of the core voltage (VCORE in FIG. 4) and the second supply voltage SB at the voltage level of the ground voltage (VSS in FIG. 4) when the first drive signal SAP1, the second drive signal SAP2, and the third drive signal SAN are enabled. The voltage generation circuit 250 may generate the first supply voltage RTO that is driven to the first setting level and the second supply voltage SB that is driven to the third setting level when the first drive signal SAP1, the second drive signal SAP2, and the third drive signal SAN are enabled. The voltage generation circuit 250 may be implemented with the same circuit as the voltage generation circuit 220 shown in FIG. 4 and perform similar operations as described above.

Figure 15:
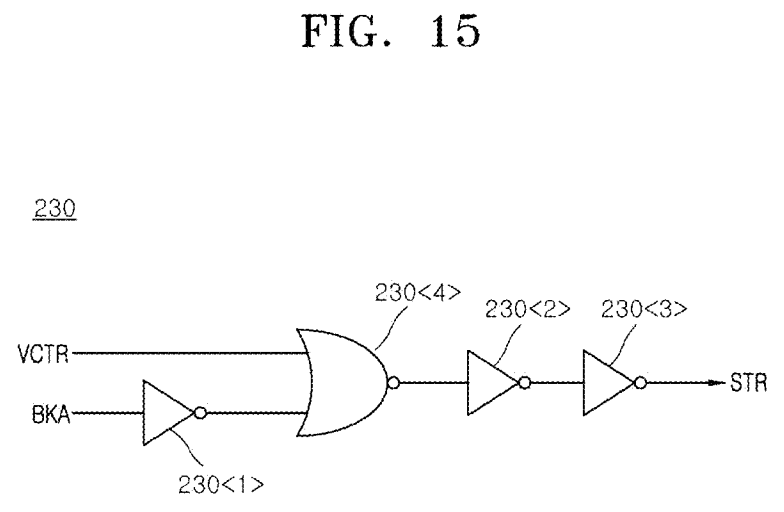

FIG. 15 is a circuit diagram illustrating an embodiment of the start signal generation circuit 230, for example, as included in the voltage control circuit 200a shown in FIG. 14.

The start signal generation circuit 230 is implemented with inverters 230<1>, 230<2>, and 230<3> and a NOR gate 230<4> in the example of FIG. 15. The start signal generation circuit 230 blocks the input of the bank active signal BKA when the voltage control signal VCTR is enabled at a logic "high" level. The start signal generation circuit 230 generates the start signal STR as disabled at a logic "low" level when the voltage control signal VCTR is enabled at a logic "high" level. The start signal generation circuit 230 generates the start signal STR as enabled at a logic "high" level when the voltage control signal VCTR is disabled at a logic "low" level and the bank active signal BKA is enabled at a logic "high" level. The start signal generation circuit 230 generates the start signal STR as disabled at a logic "low" level when the voltage control signal VCTR is disabled at a logic "low" level and the bank active signal BKA is disabled at a logic "low" level.

As described above, the semiconductor device 2, according to another embodiment of the present disclosure, deactivates the word line WL during the active operation from the time the active command ACT is input to the time the burst command BST is input to perform the mismatching cancellation operation during the test mode. The semiconductor device 2 might not perform the sensing operation after performing the mismatching cancellation operation during the test mode. The semiconductor device 2 blocks the connection between the bit line BL and the inverted bit line BLB during the settling period after performing the mismatching cancellation operation and detects the voltage levels of the bit line BL and the inverted bit line BLB to detect the connection defects between the word line WL and the bit line BL. Defects between the word line WL and the bit line BL may cause crosstalk and other operational issues that may result in data errors and inefficient data operations.

Figure 16:
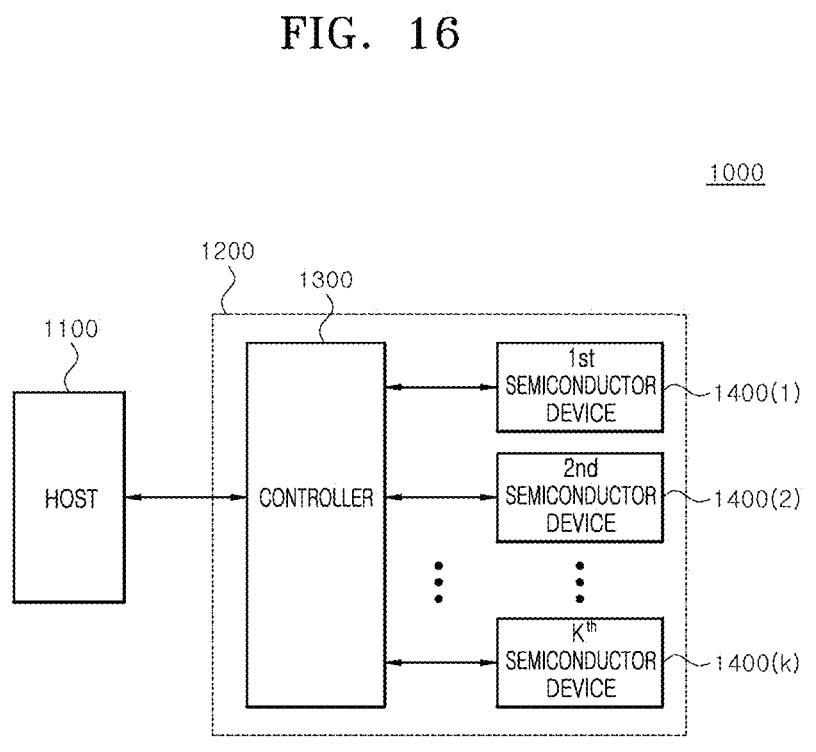

FIG. 16 is a block diagram illustrating an embodiment of an electronic system 1000 according to an embodiment of the present disclosure. As shown in FIG. 16, the electronic system 1000 includes a host 1100 and a semiconductor system 1200.

The host 1100 and the semiconductor system 1200 transmit signals to each other using interface protocols. The interface protocols used between the host 1100 and the semiconductor system 1200 may include a multi-media card (MMC), an enhanced small disk interface (ESDI), integrated drive electronics (IDE), peripheral component interconnectexpress (PCI-E), advanced technology attachment (ATA), serial ATA (SATA), parallel ATA (PATA), serial attached SCSI (SAS), universal serial bus (USB), and the like.

The semiconductor system 1200 includes a controller 1300 and K semiconductor devices 1400(1:K), where K is an integer value. The controller 1300 controls the semiconductor devices 1400(1:K) to perform the test mode and active operation(s), the mismatching cancellation operation, the sensing operation, and the pre-charge operation. Each of the semiconductor devices 1400(1:K) deactivates the word line WL to perform the mismatching cancellation operation during the first active operation during the test mode. Each of the semiconductor devices 1400(1:K) deactivates the word line WL from the time the active command ACT is input to the time the burst command BST is input to perform the mismatching cancellation operation during the test mode in an embodiment. Each of the semiconductor devices 1400(1:K) might not perform the sensing operation after performing the mismatching cancellation operation. Each of the semiconductor devices 1400(1:K) blocks the connection between the bit line BL and the inverted bit line BLB during the settling period after performing the mismatching cancellation operation and detects the voltage levels of the bit line BL and the inverted bit line BLB during the second active operation to detect the connection defects between the word line WL and the bit line BL. Each of the semiconductor devices 1400(1:K) blocks the connection between the bit line BL and the inverted bit line BLB during the settling period after performing the mismatching cancellation operation and detects the voltage levels of the bit line BL and the inverted bit line BLB to detect the connection defects between the word line WL and the bit line BL.

Each of the semiconductor devices 1400(1:K) may be implemented with the same circuit as the semiconductor device 1 shown in FIG. 1, the semiconductor device 2 shown in FIG. 10, or a combination thereof. Each of the semiconductor devices 1400(1:K) may be implemented with one of a dynamic random access memory (DRAM) device, a phase change random access memory (PRAM) device, a resistive random access memory (RRAM) device, a magnetic random access memory (MRAM) device, and a ferroelectric random access memory (FRAM).

Concepts have been disclosed in conjunction with various embodiments as described above. Those skilled in the art will understand that various modifications, additions, and substitutions are possible, without departing from the scope and spirit of the present disclosure. Accordingly, the embodiments disclosed in the present specification should be considered not from a restrictive standpoint but rather from an illustrative standpoint. Therefore, the scope of the present disclosure should not be limited to the foregoing embodiments. All changes within the meaning and range of equivalency of the claims are to be included within their scope.

What is claimed is:

1. A semiconductor device comprising:
   a control circuit configured to deactivate a word line during an active operation during a test mode, generate a matching control signal and a sense amplifier drive signal, and activate the word line after a settling period during the test mode; and
   a sense amplifier configured to drive a bit line and an inverted bit line to a same voltage level based on the matching control signal during the mismatching cancellation operation, and sense and amplify a voltage difference between the bit line and the inverted bit line based on the sense amplifier drive signal when the word line is activated after the settling period during the test mode.

2. The semiconductor device of claim 1, wherein the control circuit is configured to enable the matching control signal during the mismatching cancellation operation and enable the sense amplifier drive signal during a sensing operation.

3. The semiconductor device of claim 1, wherein the control circuit is configured to deactivate the word line after a test command is input and in response to input of a first active command and activate the word line in response to input of a second active command.

4. The semiconductor device of claim 1, wherein the sense amplifier is configured to block connection between the bit line and the inverted bit line during the settling period after the mismatching cancellation operation.

5. The semiconductor device of claim 1, wherein the control circuit comprises:

a word line drive circuit configured to, after a test command is input to initiate the test mode, deactivate the word line in response to input of the first active command and activate the word line in response to input of a second active command; and a sense amplifier control circuit configured to generate the matching cancellation signal as enabled in response to input of the first active command, generate the sense amplifier drive signal in response to input of the second active command, and generate an equalization signal as enabled in response to input of a pre-charge command.

6. The semiconductor device of claim 1, wherein the sense amplifier comprises:

a compensation circuit configured to connect an internal bit line and the bit line that are driven to a first supply voltage and to connect an internal inverted bit line and the inverted bit line that are driven to the first supply voltage when the matching control signal is enabled;

a sensing connection circuit configured to connect the internal inverted bit line to the bit line and connect the internal bit line to the inverted bit line when the sense amplifier drive signal is enabled;

a first amplification circuit configured to receive the first supply voltage, to drive the internal inverted bit line according to a voltage level of the internal bit line, and to drive the internal bit line according to a voltage level of the internal inverted bit line;

a second amplification circuit configured to receive a second supply voltage and to drive the internal bit line and the internal inverted bit line; and an equalization circuit configured to drive the internal bit line and the internal inverted bit line to a pre-charge voltage when an equalization signal is enabled.

7. The semiconductor device of claim 6, wherein the first supply voltage is driven to a second setting level after being driven to a first setting level, and the second supply voltage is drive to the second setting level after being driven to a third setting level during the mismatching cancellation operation.

8. The semiconductor device of claim 7, wherein the first setting level is higher than the second setting level, and the second setting level is higher than the third setting level, and wherein the first setting level is a voltage level of a core voltage, the second setting level is a voltage level of the pre-charge voltage, and the third setting level is a voltage level of a ground voltage.

9. A semiconductor device comprising:

a voltage control circuit configured to generate a voltage level of a first supply voltage at a first setting level, generate a voltage level of a second supply voltage at a third setting level, and subsequently generate a voltage at a second setting level for the first supply voltage and for the second supply voltage during a mismatching cancellation operation; and a sense amplifier configured to receive the first supply voltage and the second supply voltage, to drive a bit line and an inverted bit line to a same voltage level based on a matching control signal and a sense amplifier drive signal during the mismatching cancellation operation, to receive the first supply voltage and the second supply voltage, and to sense and amplify a voltage difference between the bit line and the inverted bit line when a word line is activated after a settling period during a test mode.

10. The semiconductor device of claim 9, wherein the voltage control circuit is configured to drive a voltage level of the first supply voltage from the second setting level to the first setting level and drive a voltage level of the second supply voltage from the second setting level to the third setting level in response to input of an active command.

11. The semiconductor device of claim 9, wherein the first setting level is higher than the second setting level, and the second setting level is higher than the third setting level, and wherein the first setting level is a voltage level of a core voltage, the second setting level is a voltage level of a pre-charge voltage, and the third setting level is a voltage level of a ground voltage.

12. The semiconductor device of claim 9, wherein the voltage control circuit comprises:

a drive signal generation circuit configured to generate a first drive signal, a second drive signal, and a third drive signal that are enabled in response to input of an active command; and a voltage generation circuit configured to generate the first supply voltage that is driven to the first setting level when the first drive signal and the second drive signal are enabled, and generate the second supply voltage that is driven to the third setting level when the third drive signal is enabled.

13. The semiconductor device of claim 12, wherein the voltage generation circuit comprises:

a first drive circuit coupled to a first node and configured to drive the first node to a core voltage at the first setting level when the first drive signal and the second drive signal are enabled; and a second drive circuit coupled to a second node and configured to drive the second node to a ground voltage at the third setting level when the third drive signal is enabled.

14. The semiconductor device of claim 9, wherein the sense amplifier comprises:

a compensation circuit configured to connect an internal bit line and the bit line that are driven to the first supply voltage and to connect an internal inverted bit line and the inverted bit line that are driven to the first supply voltage when the matching control signal is enabled;

a sensing connection circuit configured to connect the internal inverted bit line to the bit line and connect the internal bit line to the inverted bit line when the sense amplifier drive signal is enabled;

a first amplification circuit configured to receive the first supply voltage and to drive the internal bit line and the internal inverted bit line;

a second amplification circuit configured to receive the second supply voltage and to drive the internal bit line and the internal inverted bit line; and an equalization circuit configured to drive the internal bit line and the internal inverted bit line to a pre-charge voltage when an equalization signal is enabled.

15. The semiconductor device of claim 9, further comprising a control circuit configured to deactivate a word line and generate a matching control signal and a sense amplifier drive signal during an active operation during the test mode and to activate the word line after a settling period during the test mode.

16. The semiconductor device of claim 15, wherein the control circuit is configured to enable the matching control signal during the mismatching cancellation operation and to enable the sense amplifier drive signal during a sensing operation.

17. The semiconductor device of claim 15, wherein the control circuit is configured to deactivate the word line in response to input of a test command and a first active command, and to activate the word line in response to input of a second active command.

18. The semiconductor device of claim 15, wherein the control circuit comprises:

a word line drive circuit configured to deactivate the word line in response to input of a first active command and to activate the word line in response to input of a second active command, after input of a test command that initiates the test mode; and a sense amplifier control circuit configured to generate the matching control signal as enabled in response to input of the first active command, to generate the sense amplifier drive signal in response to input of the second active command, and to generate an enabled equalization signal in response to input of a pre-charge command.

19. The semiconductor device of claim 9, further comprising:

a memory cell connected to a word line and the bit line and configured to input and output data by sharing charge of the bit line and charge of a storage node when the word line is activated; and a detection circuit configured to sense voltage levels of the bit line and the inverted bit line to detect connection defects between the word line and the bit line during the test mode.

20. A test method comprising:

entering a test mode and deactivating a word line during a first active operation;

performing mismatching cancellation including: disabling a sense amplifier drive signal, generating a first supply voltage at a first setting level, generating a second supply voltage at a third setting level, and driving a bit line and an inverted bit line to a same voltage level; and generating the first supply voltage and the second supply voltage at a second setting level, sensing and amplifying a voltage difference between the bit line and the inverted bit line when the word line is activated during a second active operation, and sensing voltage levels of the bit line and the inverted bit line to detect connection defects between the word line and the bit line.

21. The test method of claim 20, wherein the word line is deactivated in response to input of a test command that initiates the test mode and input of a first active command that initiates the first active operation.

22. The test method of claim 20, wherein the mismatching cancellation comprises:

generating the first supply voltage at the first setting level and generating the second supply voltage at the third setting level; and receiving the first supply voltage at the first setting level and the second supply voltage at the third setting level and driving the bit line and the inverted bit line to the same voltage level when a matching control signal is enabled during the mismatching cancellation operation.

23. The test method of claim 20, wherein connection between the bit line and the inverted bit line is blocked during a settling period after the mismatching cancellation operation.

24. The test method of claim 20, further comprising:

after generating the first supply voltage at the first setting level and generating the second supply voltage at the third setting level, generating the first supply voltage and the second supply voltage at the second setting level;

activating the word line in response to input of a second active command that initiates the second active operation; and sensing and amplifying a voltage difference between the bit line and the inverted bit line when the word line is activated, and sensing voltage levels of the bit line and the inverted bit line to detect connection defects between the word line and the bit line.

25. A semiconductor device comprising:

a control circuit configured to deactivate a word line from an input time of an active command to an input time of a burst command during a test mode, to generate a matching control signal and a sense amplifier drive signal, and to activate the word line after a settling period during the test mode; and a sense amplifier configured to drive a bit line and an inverted bit line to a same voltage level based on the matching control signal during a mismatching cancellation operation and to sense and amplify a voltage difference between the bit line and the inverted bit line based on the sense amplifier drive signal when the word line is activated after the settling period during the test mode.

26. The semiconductor device of claim 25, wherein the sense amplifier is configured to block connection between the bit line and the inverted bit line during the settling period that begins after the mismatching cancellation operation.

27. The semiconductor device of claim 25, wherein the control circuit comprises:

a test control signal generation circuit configured to generate a test control signal, based on a test command that initiates the test mode, the active command, and the burst command;

a word line drive circuit configured to deactivate the word line based on the test control signal and a pre-word line signal and to activate the word line based on the test control signal and the pre-word line signal; and a sense amplifier control circuit configured to generate the matching control signal and the sense amplifier drive signal that are enabled in response to input of the active command, and generate an enabled equalization signal in response to input of a pre-charge command.

28. The semiconductor device of claim 25, wherein the sense amplifier comprises:

a compensation circuit configured to connect an internal bit line and the bit line that are driven to a first supply voltage and to connect an internal inverted bit line and the inverted bit line that are driven to the first supply voltage when the matching control signal is enabled;

a sensing connection circuit configured to connect the internal inverted bit line to the bit line and connect the internal bit line to the inverted bit line when the sense amplifier drive signal is enabled;

a first amplification circuit configured to receive the first supply voltage, to drive the internal inverted bit line according to a voltage level of the internal bit line, and to drive the internal bit line according to a voltage level of the internal inverted bit line;

a second amplification circuit configured to receive a second supply voltage and to drive the internal bit line and the internal inverted bit line; and an equalization circuit configured to drive the internal bit line and the internal inverted bit line to a pre-charge voltage when an equalization signal is enabled.

29. The semiconductor device of claim 28, wherein the first supply voltage is driven to a second setting level after being driven to a first setting level during the mismatching cancellation operation, and wherein the second supply voltage is driven to the second setting level after being driven to a third setting level.

30. The semiconductor device of claim 29, wherein the first setting level is higher than the second setting level and the second setting level is higher than the third setting level, and wherein the first setting level is a voltage level of a core voltage, the second setting level is a voltage level of the pre-charge voltage, and the third setting level is a voltage level of a ground voltage.

31. A method comprising:

during a first operation of a test mode, deactivating a word line and performing mismatching cancellation including generating a first supply voltage at a first setting level, generating a second supply voltage at a third setting level, and driving a bit line and an inverted bit line to a same voltage level; and during a second operation of the test mode, sensing and amplifying a voltage difference between the bit line and the inverted bit line when the word line is activated and sensing voltage levels of the bit line and the inverted bit line to detect connection defects between the word line and the bit line.

* * * * *